(12) United States Patent
Nakao

(10) Patent No.: US 8,981,440 B2
(45) Date of Patent: Mar. 17, 2015

(54) SEMICONDUCTOR STORAGE DEVICE AND METHOD FOR MANUFACTURING THE SEMICONDUCTOR STORAGE DEVICE

(75) Inventor: Yuichi Nakao, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 115 days.

(21) Appl. No.: 13/119,070

(22) PCT Filed: Sep. 16, 2009

(86) PCT No.: PCT/JP2009/004653
§ 371 (c)(1),
(2), (4) Date: Mar. 15, 2011

(87) PCT Pub. No.: WO2010/032456
PCT Pub. Date: Mar. 25, 2010

(65) Prior Publication Data
US 2011/0169135 A1    Jul. 14, 2011

(30) Foreign Application Priority Data

Sep. 16, 2008  (JP) ................. 2008-236647
Sep. 16, 2008  (JP) ................. 2008-236648

(51) Int. Cl.
*H01L 21/02*    (2006.01)
*H01L 49/02*    (2006.01)
(Continued)

(52) U.S. Cl.
CPC .......... *H01L 28/55* (2013.01); *H01L 21/76849* (2013.01); *H01L 21/7687* (2013.01); *H01L 27/11504* (2013.01); *H01L 27/11507* (2013.01)
USPC .... 257/295; 257/296; 257/532; 257/E27.104; 257/E21.664

(58) Field of Classification Search
CPC ................. H01L 21/7687; H01L 28/55; H01L 27/11507

USPC ............ 25/295, 296, 298, E27.104, E29.167, 25/E29.272, E21.663, E21.664; 257/295, 257/296, 298, E27.104, E29.167, E29.272, 257/E21.663, E21.664, 532
See application file for complete search history.

(56) References Cited

U.S. PATENT DOCUMENTS 5,986,301 A * 11/1999 Fukushima et al. .......... 257/306
6,548,343 B1 *  4/2003 Summerfelt et al. ......... 438/240
(Continued)

FOREIGN PATENT DOCUMENTS

JP    9-139480 A    5/1997
JP    2001-217400 A    8/2001
(Continued)

*Primary Examiner* — Cuong Q Nguyen
*Assistant Examiner* — Yosef Gebreyesus
(74) *Attorney, Agent, or Firm* — Rabin & Berdo, P.C.

(57) ABSTRACT

A semiconductor-storage-device manufacturing method of the present invention is a method for manufacturing a semiconductor storage device provided with a ferroelectric capacitor including a lower electrode, a ferroelectric film, and an upper electrode, and the method includes a step of embedding a first metal plug and a second metal plug in an insulating layer; a step of forming a covering layer that covers at least the second metal plug while securing apart that comes into electric contact with the first metal plug; a step of forming a deposit structure by sequentially depositing a material for the lower electrode, a material for the ferroelectric film, and a material for the upper electrode after forming the covering layer; and a step of forming the ferroelectric capacitor by etching and removing other parts except a part of the deposit structure such that the part of the deposit structure remains on the first metal plug.

15 Claims, 19 Drawing Sheets

(51) Int. Cl.
*H01L 21/768* (2006.01)
*H01L 27/115* (2006.01)

(56) References Cited

U.S. PATENT DOCUMENTS

| | | | |
|---|---|---|---|
| 6,576,546 B2 | 6/2003 | Gilbert et al. | |
| 6,734,477 B2 * | 5/2004 | Moise et al. | 257/295 |
| 6,737,694 B2 * | 5/2004 | Kim et al. | 257/296 |
| 7,022,531 B2 * | 4/2006 | Ozaki et al. | 438/3 |
| 7,132,300 B2 * | 11/2006 | Tatsunari et al. | 438/3 |
| 7,253,463 B2 * | 8/2007 | Yamada | 257/295 |
| 7,989,862 B2 * | 8/2011 | Noda | 257/295 |
| 2002/0024085 A1 * | 2/2002 | Nakamura et al. | 257/306 |
| 2003/0030084 A1 | 2/2003 | Moise et al. | |
| 2004/0046196 A1 * | 3/2004 | Kim | 257/296 |
| 2004/0113189 A1 | 6/2004 | Takamatsu et al. | |
| 2005/0023589 A1 * | 2/2005 | Yamada et al. | 257/310 |
| 2005/0145908 A1 * | 7/2005 | Moise et al. | 257/295 |
| 2006/0054948 A1 | 3/2006 | Yamada | |
| 2006/0267060 A1 * | 11/2006 | Kutsunai et al. | 257/296 |
| 2007/0032015 A1 | 2/2007 | Itoh et al. | |
| 2007/0040196 A1 * | 2/2007 | Matsuura | 257/295 |
| 2007/0131994 A1 * | 6/2007 | Sawasaki | 257/295 |
| 2009/0280577 A1 | 11/2009 | Takamatsu et al. | |

FOREIGN PATENT DOCUMENTS

| | | |
|---|---|---|
| JP | 2002-76307 A | 3/2002 |
| JP | 2003-110095 A | 4/2003 |
| JP | 2004-153019 A | 5/2004 |
| JP | 2005-44972 A | 2/2005 |
| JP | 2006-86292 A | 3/2006 |
| JP | 2007-036126 A | 2/2007 |
| JP | 2008-135619 A | 6/2008 |

* cited by examiner

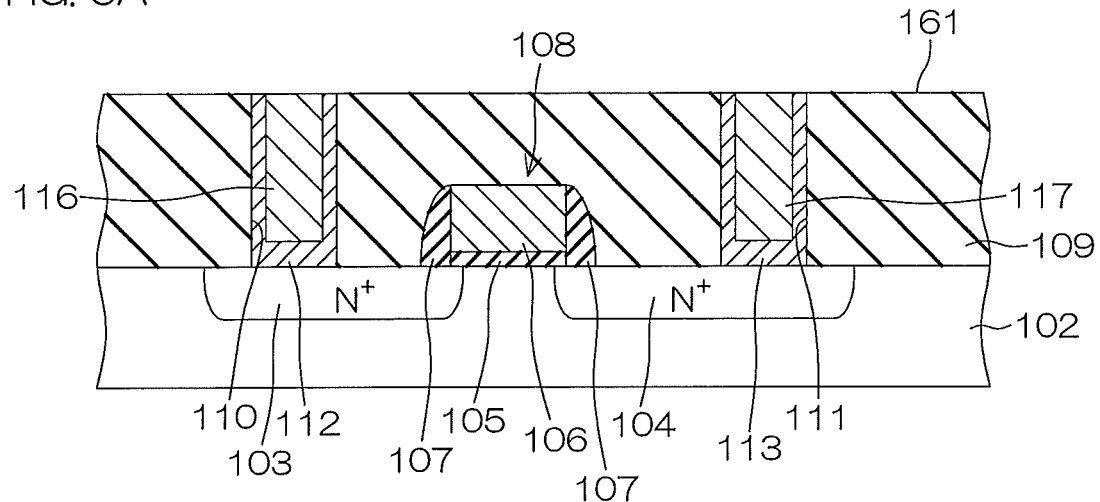
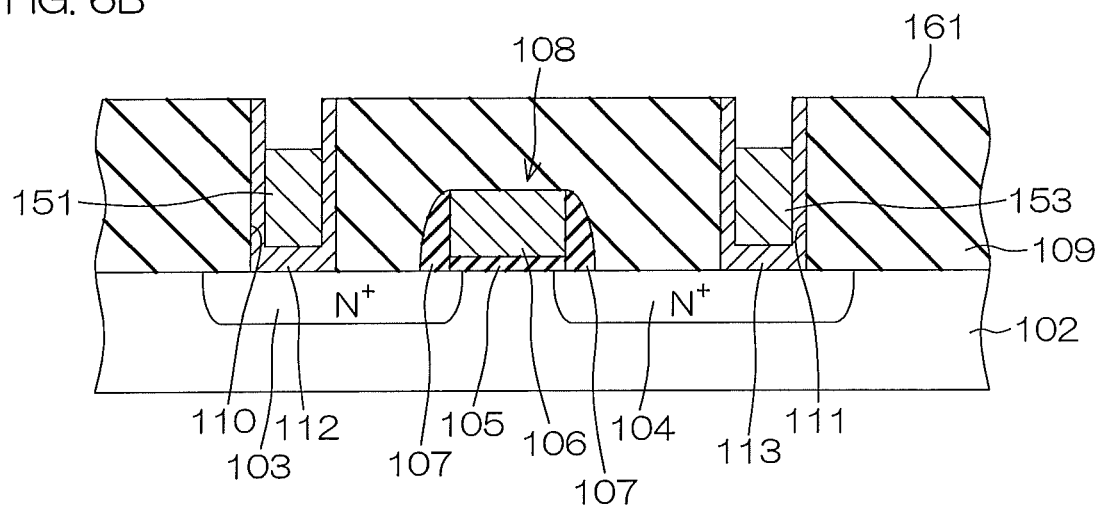

SEMICONDUCTOR STORAGE DEVICE AND METHOD FOR MANUFACTURING THE SEMICONDUCTOR STORAGE DEVICE

TECHNICAL FIELD

This invention relates to a semiconductor storage device and a method for manufacturing the semiconductor storage device.

BACKGROUND ART

A ferroelectric memory (FeRAM: Ferroelectric Random Access Memory) including a ferroelectric capacitor is conventionally known as a nonvolatile memory capable of retaining its memory contents even when a power supply is turned off. Conventional ferroelectric memories are manufactured through, for example, the following manufacturing process.

FIG. 7A to FIG. 7H are schematic sectional views of a conventional ferroelectric-memory manufacturing method shown in process sequence in which a ferroelectric memory is produced.

In this manufacturing method, first, an N type impurity is injected into a surface part of a P type silicon substrate 201 as shown in FIG. 7A, and, as a result, an N$^+$ type region 202 and N$^+$ type region 203 are formed. Thereafter, thermal oxidation and patterning are performed, and, as a result, a gate insulating film 204 extending like a bridge from the N$^+$ type region 202 to the N$^+$ type region 203 is formed on the surface of the silicon substrate 201. Thereafter, polysilicon (doped polysilicon) densely doped with an impurity is deposited on the silicon substrate 201 by a CVD method, is then subjected to patterning, and, as a result, a gate electrode 205 is formed on the gate insulating film 204. Thereafter, by the CVD method, silicon oxide is deposited on the silicon substrate 201, is then subjected to etchback, and, as a result, a sidewall 206 surrounding a side wall of the gate electrode 205 is formed. In this way, a MOSFET 207 including the gate electrode 205 (Metal), the gate insulating film 204 (Oxide), the silicon substrate 201 (Semiconductor) having the N$^+$ type region 202 (Drain region) and the N$^+$ type region 203 (Source region) is formed as shown in FIG. 7A.

After forming the MOSFET 207, a first insulating layer 208 made of silicon oxide is stacked on the silicon substrate 201 by the CVD method. Thereafter, the first insulating layer 208 is subjected to patterning. As a result, a drain contact hole 209 leading from the upper surface of the first insulating layer 208 to the N$^+$ type region 202 (Drain region) is formed. Additionally, a source contact hole 210 leading from the upper surface of the first insulating layer 208 to the N$^+$ type region 203 (Source region) is formed.

Thereafter, by the sputtering method, a conductive material that contains titanium is deposited such that the inner surface of the drain contact hole 209 and the inner surface of the source contact hole 210 are covered with the conductive material and such that the upper surface of the first insulating layer 208 is covered therewith. Thereafter, by the CVD method, tungsten is deposited such that the drain contact hole 209 and the source contact hole 210 are filled with this tungsten. Thereafter, the conductive material that contains titanium and the tungsten material are polished by CMP treatment until the upper surface of the tungsten material and the upper surface of the first insulating layer 208 become flush with each other. In this way, a drain contact plug 213 embedded in the drain contact hole 209 is formed via a barrier film 211 as shown in FIG. 7A. Additionally, a source contact plug 214 embedded in the source contact hole 210 is formed via a barrier film 212. The drain contact plug 213 is brought into electric contact with the N$^+$ type region 202 (Drain region) via the barrier film 211. On the other hand, the source contact plug 214 is brought into electric contact with the N$^+$ type region 203 (Source region) via the barrier film 212.

Thereafter, by the sputtering method, a lower conductive material film 215 made of a conductive material that contains Ir (iridium), a ferroelectric material film 216 made of PZT (titanic acid lead zirconate), and an upper conductive material film 217 made of a conductive material that contains Ir (iridium) are stacked in this order on the first insulating layer 208 as shown in FIG. 7B. As a result, a layered structure 239 is formed on the first insulating layer 208.

Thereafter, as shown in FIG. 7C, a hard mask 240 made of TiN is formed at a part of the layered structure 239 located on the drain contact plug 213. Thereafter, the layered structure 239 is etched via this hard mask 240 at an etching temperature of 300° C. or more. In this way, a ferroelectric capacitor 221 consisting of the lower electrode 218, the ferroelectric film 219, and the upper electrode 220 is formed on the drain contact plug 213. The lower electrode 218 of the ferroelectric capacitor 221 comes into contact with the drain contact plug 213, and, as a result, is electrically connected to the N$^+$ type region 202 (Drain region) via the drain contact plug 213. The hard mask 240 that has been thinned by etching remains on the upper electrode 220.

Thereafter, alumina is deposited on the first insulating layer 208 by the sputtering method, and, in addition, SiN is deposited thereon by the PECVD method. As a result, as shown in FIG. 7D, a first hydrogen barrier film 222 and a second hydrogen barrier film 223 are formed to protect the ferroelectric capacitor 221 from hydrogen.

Thereafter, by the CVD method, a second insulating layer 224 made of silicon oxide is stacked on the second hydrogen barrier film 223 as shown in FIG. 7E.

Thereafter, the second insulating layer 224 is polished by CMP treatment, and the upper surface of the second insulating layer 224 is flattened. Thereafter, as shown in FIG. 7F, the second insulating layer 224, the second hydrogen barrier film 223, and the first hydrogen barrier film 222 are subjected to patterning. As a result, a PL wiring via-hole 225 leading from the upper surface of the second insulating layer 224 to the hard mask 240 is formed. Additionally, a BL wiring via-hole 226 leading from the upper surface of the second insulating layer 224 to the source contact plug 214 is formed.

Thereafter, by the sputtering method, a conductive material that contains titanium is deposited such that the inner surface of the PL wiring via-hole 225 and the inner surface of the BL wiring via-hole 226 are covered therewith and such that the upper surface of the second insulating layer 224 is covered therewith. Thereafter, by the CVD method, tungsten is deposited such that the PL wiring via-hole 225 and the BL wiring via-hole 226 are filled therewith. Thereafter, the conductive material that contains titanium and the tungsten material are polished by CMP treatment until the upper surface of the tungsten material and the upper surface of the second insulating layer 224 become flush with each other. In this way, as shown in FIG. 7G, a PL wiring plug 229 embedded in the PL wiring via-hole 225 is formed via the barrier film 227. Additionally, a BL wiring plug 230 embedded in the BL wiring via-hole 226 is formed via the barrier film 228. The PL wiring plug 229 is brought into electric contact with the upper electrode 220 via the barrier film 227 and the hard mask 240. On the other hand, the BL wiring plug 230 is brought into electric contact with the source contact plug 214 via the barrier film 228.

Thereafter, by the sputtering method, a conductive material that contains titanium, a conductive material that contains aluminum, and a conductive material that contains titanium are stacked on the second insulating layer 224, and are subjected to patterning. As a result, a PL wiring 231 (i.e., a wiring that has a three-layer structure consisting of a titanium layer 233, an aluminum layer 234, and a titanium layer 235) that is brought into electric contact with the PL wiring plug 229 and a BL wiring 232 (i.e., a wiring that has a three-layer structure consisting of a titanium layer 236, an aluminum layer 237, and a titanium layer 238) that is brought into electric contact with the BL wiring plug 230 are formed as shown in FIG. 7H.

Thereafter, a word line 241 is connected to the gate electrode 205, and a plate line 242 is connected to the PL wiring 231, and a bit line 243 is connected to the BL wiring 232.

In this way, the ferroelectric memory 200 including the ferroelectric capacitor 221 can be obtained as shown in FIG. 7H.

PRIOR ART DOCUMENTS

Patent Literatures

Patent Literature 1: Japanese Published Patent Application No. 2004-153019

BRIEF SUMMARY OF THE INVENTION

Problems to be Solved by the Invention

In recent years, the miniaturization of ferroelectric memories has been advanced, and, for example, a ferroelectric memory has been intended to be miniaturized by reducing the area (i.e., capacitor area) of a ferroelectric capacitor provided in the memory.

Ir and Pt, each of which is used as a material for lower electrodes and upper electrodes, and PZT, which is used as a material for ferroelectric films, are not easily etched. Therefore, under normal dry etching conditions, the side surface of the ferroelectric capacitor becomes oblique without becoming vertical with respect to the stacked-layer interface even if a layered structure formed by stacking a lower-electrode material, a ferroelectric-film material, and an upper-electrode material on each other is etched in a vertical direction. If this side surface of the ferroelectric capacitor can be arranged to be substantially vertical with respect to the stacked-layer interface, the capacitor area can be reduced without lowering the capacity of the ferroelectric capacitor.

Therefore, a possible technique has been proposed for subjecting the layered structure 239 to high-temperature etching (e.g., etching performed at a temperature of 300° C. or more) via the hard mask 240 having heat-resisting properties. According to this technique, it is possible to form the ferroelectric capacitor 221 having a steeply oblique side surface that is substantially vertical with respect to the stacked-layer interface.

However, there is an abnormal etching case in which, during high-temperature etching, the source contact plug 214 disposed below a to-be-etched part of the layered structure 239 is etched together with the layered structure 239. If the source contact plug 214 undergoes abnormal etching, an electrical conduction failure will occur between the source contact plug 214 and the BL wiring plug 230, and, as a result, the reliability of the ferroelectric memory 200 will decrease.

It is an object of the present invention to provide a semiconductor storage device capable of achieving miniaturization without abnormally etching a second metal plug differing from a first metal plug connected to a ferroelectric capacitor, and to provide a method for manufacturing the semiconductor storage device.

Means for Solving the Problems

A semiconductor storage device according to an aspect of the present invention includes an insulating layer; a ferroelectric capacitor formed on the insulating layer, the ferroelectric capacitor including a lower electrode, a ferroelectric film, and an upper electrode; an interlayer insulating film formed on the insulating layer, the interlayer insulating film having an opening at a part thereof at which the ferroelectric capacitor is disposed; a first metal plug embedded in the insulating layer and connected to the lower electrode via the opening; and a second metal plug embedded in the insulating layer outside the ferroelectric capacitor when viewed planarly.

This semiconductor storage device can be manufactured by, for example, a semiconductor-storage-device manufacturing method of the present invention, and the manufacturing method is a method for manufacturing a semiconductor storage device provided with a ferroelectric capacitor including a lower electrode, a ferroelectric film, and an upper electrode, and the method includes a step of embedding a first metal plug and a second metal plug in an insulating layer; a step of forming a covering layer that covers at least the second metal plug while securing apart that comes into electric contact with the first metal plug; a step of forming a deposit structure by sequentially depositing a material for the lower electrode, a material for the ferroelectric film, and a material for the upper electrode after forming the covering layer; and a step of forming the ferroelectric capacitor by etching and removing other parts except a part of the deposit structure such that the part of the deposit structure remains on the first metal plug.

Specifically, the semiconductor storage device can be manufactured by a method for manufacturing a semiconductor storage device provided with a ferroelectric capacitor including a lower electrode, a ferroelectric film, and an upper electrode, and the method includes a step of embedding a first metal plug and a second metal plug in an insulating layer; a step of forming an interlayer insulating film on the insulating layer; a step of forming an opening in the interlayer insulating film, the first metal plug being exposed by the opening; a step of forming a deposit structure by sequentially depositing a material for the lower electrode, a material for the ferroelectric film, and a material for the upper electrode after forming the opening; and a step of etching and removing other parts except a part of the deposit structure such that the part of the deposit structure remains on the opening.

In this method, the first metal plug and the second metal plug are embedded in the insulating layer, and then the interlayer insulating film is formed on the insulating layer. An opening by which the first metal plug is exposed is formed in the interlayer insulating film. As a result, the first metal plug is exposed via the opening of the interlayer insulating film, whereas the second metal plug is covered with the interlayer insulating film.

In this state, a part of the deposit structure formed on the interlayer insulating film (i.e., other parts except a part thereof remaining on the opening of the interlayer insulating film) is removed by etching, and, as a result, a ferroelectric capacitor is formed.

When the deposit structure is etched, the second metal plug is covered with the interlayer insulating film. Therefore, protection given by the interlayer insulating film makes it possible to prevent the second metal plug from being abnormally etched even if the deposit structure is etched at a high temperature. As a result, it is possible to inhibit the occurrence of an electrical conduction failure between the second metal plug and a connection element connected to this second metal plug, and it is possible to restrain a decrease in reliability.

Additionally, the deposit structure is etched at a high temperature, and, as a result, the side surface of the ferroelectric capacitor that appears by performing etching can be set as a vertical surface or a steeply oblique surface that is almost a vertical surface with respect to the stacked-layer interface of the ferroelectric capacitor. As a result, the area of the ferroelectric capacitor can be reduced, and therefore the semiconductor storage device can be miniaturized.

Additionally, preferably, in the semiconductor storage device, an upper surface of the first metal plug and an upper surface of the second metal plug are flush with each other.

In this case, the semiconductor storage device can be manufactured by, for example, a method for manufacturing the semiconductor storage device, in which the step of embedding the first metal plug and the second metal plug in the insulating layer includes a step of forming a first through-hole and a second through-hole in the insulating layer; a step of depositing a plug material on the insulating layer in such a way as to fill the first through-hole and the second through-hole therewith; and a step of forming the first metal plug and the second metal plug by removing a remaining plug material except the plug material of the first through-hole and the plug material of the second through-hole until an upper surface of the plug material and an upper surface of the insulating layer become flush with each other.

In this method, the first through-hole and the second through-hole are formed, and a plug material is deposited in such a way as to fill these through-holes therewith, and then this plug material is partially removed until the upper surface of the plug material and the upper surface of the insulating layer become flush with each other. As a result, the first metal plug and the second metal plug that are flush with each other are formed.

A plurality of steps of forming the first metal plug and a plurality of steps of forming the second metal plug are performed in parallel with each other as described above, and therefore the manufacturing process of the semiconductor storage device can be simplified.

A semiconductor storage device according to another aspect of the present invention includes an insulating layer having a first through-hole and a second through-hole; a ferroelectric capacitor formed on the insulating layer such that the first through-hole is covered therewith, the ferroelectric capacitor including a lower electrode, a ferroelectric film, and an upper electrode; a first metal plug embedded in the first through-hole and brought into electric contact with the lower electrode; a second metal plug embedded in the second through-hole; and a conductive cap with which an upper surface of at least the second metal plug of the first metal plug and the second metal plug is covered, the conductive cap made of a conductive material having an etching selection ratio with respect to a material for the lower electrode and a material for the upper electrode.

According to this structure, an upper surface of at least the second metal plug of the first and second metal plugs is covered with a conductive cap made of a conductive material having an etching selection ratio with respect to a material for the lower electrode and a material for the upper electrode. The upper surface of the second metal plug is protected by the conductive cap by being covered with the conductive cap.

Therefore, protection given by the conductive cap makes it possible to prevent the second metal plug from being abnormally etched even if the lower electrode, the ferroelectric film, and the upper electrode are molded at a high temperature. As a result, it is possible to inhibit the occurrence of an electrical conduction failure between the second metal plug and a connection element connected to this second metal plug, and it is possible to restrain a decrease in reliability.

Additionally, the ferroelectric capacitor is formed by molding the lower electrode, the ferroelectric film, and the upper electrode at a high temperature, and, as a result, the side surface of the ferroelectric capacitor that appears by performing etching can be set as a vertical surface or a steeply oblique surface that is almost a vertical surface with respect to the stacked-layer interface of the ferroelectric capacitor. As a result, the area of the ferroelectric capacitor can be reduced, and therefore the semiconductor storage device can be miniaturized.

This semiconductor storage device can be manufactured by, for example, a semiconductor-storage-device manufacturing method of the present invention, and the manufacturing method is a method for manufacturing a semiconductor storage device provided with a ferroelectric capacitor including a lower electrode, a ferroelectric film, and an upper electrode, and the method includes a step of embedding a first metal plug and a second metal plug in an insulating layer; a step of forming a covering layer that covers at least the second metal plug while securing a part that comes into electric contact with the first metal plug; a step of forming a deposit structure by sequentially depositing a material for the lower electrode, a material for the ferroelectric film, and a material for the upper electrode after forming the covering layer; and a step of forming the ferroelectric capacitor by etching and removing other parts except a part of the deposit structure such that the part of the deposit structure remains on the first metal plug.

Additionally, preferably, in the semiconductor storage device, the conductive cap is made of conductive nitride.

The conductive nitride used for the conductive cap has a great etching selection ratio with respect to the lower electrode and the upper electrode each of which is made of, for example, a conductive material that contains a noble metal (specifically, Au-based material, Ag-based material, Pt-based material, Pd-based material, Rh-based material, Ir-based material, Ru-based material, and Os-based material). Therefore, in this aspect, the second metal plug can be effectively prevented from being abnormally etched.

Additionally, preferably, in the semiconductor storage device, the first metal plug and the second metal plug are buried to a middle part of the first through-hole and a middle part of the second through-hole, respectively, and the conductive cap is embedded in the first through-hole and in the second through-hole in such a way as to become flush with a surface of the insulating layer.

According to this structure, the first metal plug and the conductive cap are embedded in the first through-hole. Additionally, the second metal plug and the conductive cap are embedded in the second through-hole. In other words, a structure embedded in the first through-hole and a structure embedded in the second through-hole are identical with each other.

Therefore, the semiconductor storage device according to this aspect can be manufactured by, for example, a method for manufacturing a semiconductor storage device provided with a ferroelectric capacitor including a lower electrode, a ferroelectric film, and an upper electrode, and the method includes a step of forming a first through-hole and a second through-hole in the insulating layer; a step of filling the first through-hole and the second through-hole with a metallic material; a step of forming a first metal plug buried to a middle part of the first through-hole and a second metal plug buried to a middle part of the second through-hole by partially removing the metallic material by etching; a step of forming a conductive plug that covers the upper surface of the first metal plug and the upper surface of the second metal plug by filling the first through-hole and the second through-hole with a conductive material having an etching selection ratio with respect to the material for the lower electrode and the material for the upper electrode after forming the first metal plug and the second metal plug; a step of forming a deposit structure by sequentially depositing a material for the lower electrode, a material for the ferroelectric film, and a material for the upper electrode on the insulating layer; and a step of forming the ferroelectric capacitor by etching and removing other parts except a part of the deposit structure such that the part of the deposit structure remains on the first metal plug.

In this manufacturing method, each of the first through-hole and the second through-hole is filled with a metallic material, and then the metallic material in each of these through-holes is partially removed, and, as a result, the first metal plug and the second metal plug are formed. After forming these plugs, the first through-hole and the second through-hole are filled with a conductive material having an etching selection ratio with respect to the lower electrode and the upper electrode, and, as a result, a conductive plug with which the upper surface of the first metal plug and the upper surface of the second metal plug are covered and that is flush with the surface of the insulating layer is formed.

In this way, the step of forming the first metal plug and the step of forming the second metal plug are performed in parallel with each other, and, likewise, the steps of forming conductive plugs with which the upper surfaces of these plugs are respectively covered are performed in parallel with each other, and therefore the manufacturing process of the semiconductor storage device can be simplified.

BRIEF DESCRIPTION OF THE DRAWINGS

FIG. 6A is a schematic sectional view of a method for manufacturing the ferroelectric memory of FIG. 5 shown in process sequence.

FIG. 6B is a sectional view showing a step subsequent to that of FIG. 6A.

MODES FOR CARRYING OUT THE INVENTION

Embodiments of the present invention will be hereinafter described in more detail with reference to the accompanying drawings.

Figure 1:
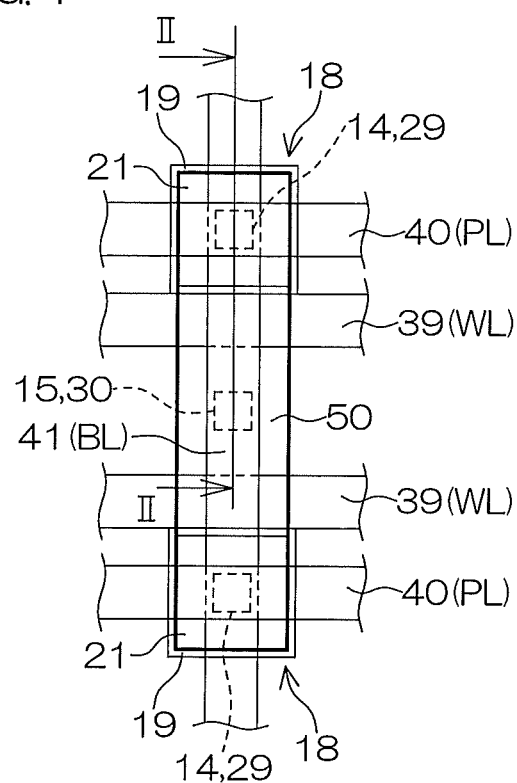
FIG. 1 is a schematic plan view of a ferroelectric memory according to a first embodiment of the present invention.
Figure 2:
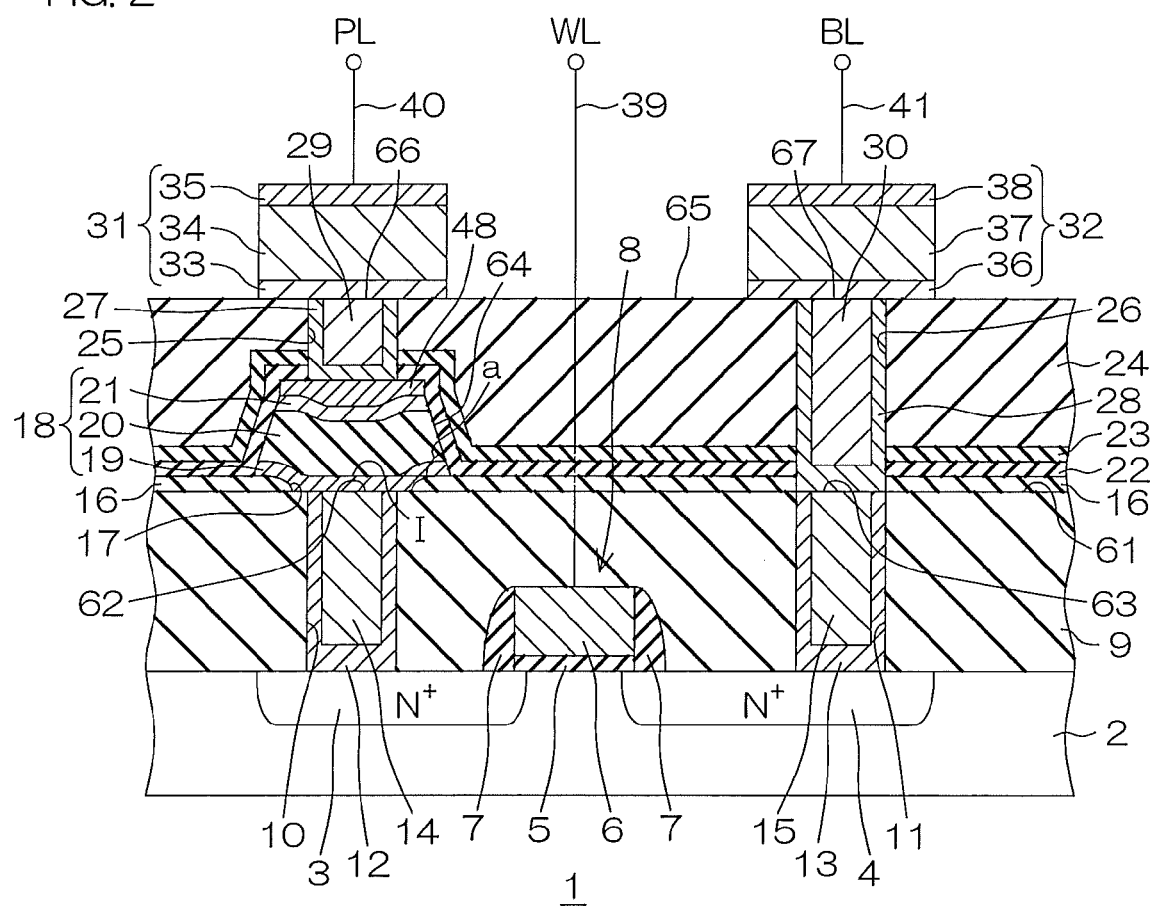
FIG. 2 is a sectional view of the ferroelectric memory of FIG. 1 along cutting-plane line II-II.

FIG. 1 is a schematic plan view of a ferroelectric memory according to a first embodiment of the present invention. FIG. 2 is a sectional view of the ferroelectric memory of FIG. 1 along cutting-plane line II-II.

The ferroelectric memory 1 serving as a semiconductor storage device is a nonvolatile memory capable of retaining its memory contents even when a power supply is turned off.

The ferroelectric memory 1 includes a P type silicon substrate 2 as shown in FIG. 2.

For example, a plurality of active regions 50, each of which has a rectangular shape when viewed planarly, are formed on the silicon substrate 2. The outline of the active region 50 is shown by a heavy line in FIG. 1. The active regions 50 are arranged in a matrix manner so as to be arrayed in its longitudinal direction and in a direction perpendicular to the longitudinal direction.

Each of the active regions 50 has a plurality of memory cells (two memory cells in this embodiment) each of which retains one-bit information. One of the memory cells is shown in FIG. 2.

Each memory cell has a 1T1C-type cell structure in which one ferroelectric capacitor (C) 18 and one MOSFET (T) 8 are arranged so as to have a stacked-layer relationship.

As shown in FIG. 2, in the active region 50 (i.e., in each memory cell), an N$^+$ type drain region 3 and an N$^+$ type source region 4 are formed with a gap therebetween at a surface part of the silicon substrate 2. The source region 4 is used as a region shared with the MOSFETs 8 of the two memory cells, and is formed in the center part of the active region 50 when viewed planarly. On the other hand, in correlation with the MOSFET 8 of each memory cell, the drain region 3 is formed at one end of the active region 50 and at the other end thereof when viewed planarly.

Additionally, a gate insulating film 5 that extends like a bridge from the drain region 3 to the source region 4 is formed on the surface of the silicon substrate 2. The gate insulating film 5 is made of, for example, silicon oxide.

A gate electrode 6 made of, for example, polysilicon (i.e., doped polysilicon) doped with an impurity is formed on the gate insulating film 5.

A sidewall 7 is formed on the side wall of the gate electrode 6 in such a manner as to be in close contact therewith over its whole circumference. The sidewall 7 is made of, for example, silicon oxide.

In this way, the ferroelectric memory 1 has the MOSFET 8 that includes the gate electrode (i.e., metal) 6, the gate insulating film (i.e., oxide) 5, and the silicon substrate (i.e., semiconductor) 2 including the drain region 3 and the source region 4.

A first insulating layer 9 is stacked on the silicon substrate 2. The first insulating layer 9 is made of, for example, silicon oxide. The thickness of the first insulating layer 9 is, for example, 0.4 to 0.9 μm.

A drain contact hole 10 that leads from the upper surface 61 of the first insulating layer 9 to the drain region 3 is formed at a part of the first insulating layer 9 that faces the drain region 3.

A drain contact plug 14 made of a metallic material, such as tungsten, is embedded in the drain contact hole 10. The drain contact hole 10 is filled with the drain contact plug 14 serving as a first metal plug until the upper surface 62 of the drain contact plug 14 becomes flush with the upper surface 61 of the first insulating layer 9.

In the drain contact hole 10, a barrier film 12 is interposed between its inner surface (i.e., the side surface formed by the first insulating layer 9 and the bottom surface formed by the silicon substrate 2) and the drain contact plug 14. The barrier film 12 is made of, for example, a conductive material (e.g., TiN, Ti, etc.) that contains titanium.

The electrically-conductive barrier film 12 is interposed therebetween, and, as a result, the drain contact plug 14 is brought into electric contact with the drain region 3 via the barrier film 12.

In the first insulating layer 9, a source contact hole 11 that leads from the upper surface 61 of the first insulating layer 9 to the source region 4 is formed at a part of the first insulating layer 9 that faces the source region 4.

A source contact plug 15 made of a metallic material, such as tungsten, is embedded in the source contact hole 11. The source contact hole 11 is filled with the source contact plug 15 serving as a second metal plug until its upper surface 63 becomes flush with the upper surface 61 of the first insulating layer 9. The upper surface 63 of the source contact plug 15 is flush with the upper surface 61 of the first insulating layer 9, and, as a result, the upper surface 63 of the source contact plug 15 and the upper surface 62 of the drain contact plug 14 are flush with each other.

In the source contact hole 11, a barrier film 13 is interposed between its inner surface (i.e., the side surface formed by the first insulating layer 9 and the bottom surface formed by the silicon substrate 2) and the source contact plug 15. The barrier film 13 is made of, for example, a conductive material (e.g., TiN, Ti, etc.) that contains titanium.

The electrically-conductive barrier film 13 is interposed therebetween, and, as a result, the source contact plug 15 is brought into electric contact with the source region 4 via the barrier film 13.

An interlayer insulating film 16 interposed between the first insulating layer 9 and a second insulating layer 24 (described later) is formed on the first insulating layer 9. The thickness of the interlayer insulating film 16 is smaller than that of the first insulating layer 9, and is, for example, 0.05 to 0.2 μm. An opening 17 by which the whole of the upper surface 62 of the drain contact plug 14 is exposed is formed at a part of the interlayer insulating film 16 that faces the drain contact plug 14.

The ferroelectric capacitor 18 is disposed on the opening 17 of the interlayer insulating film 16, i.e., is disposed, when viewed planarly, at a position at which the ferroelectric capacitor 18 lies on the drain contact plug 14 and at which the ferroelectric capacitor 18 does not lie on the source contact plug 15.

The ferroelectric capacitor 18 includes a lower electrode 19, an upper electrode 21, and a ferroelectric film 20 placed between the lower electrode 19 and the upper electrode 21.

The lower electrode 19 is made of a conductive material that contains a noble metal (specifically, Au-based material, Ag-based material, Pt-based material, Pd-based material, Rh-based material, Ir-based material, Ru-based material, and Os-based material). The thickness of the lower electrode 19 is, for example, 0.05 to 0.2 μm. The lower electrode 19 enters the opening 17, and is in contact with the upper surface 62 of the drain contact plug 14. As a result, the lower electrode 19 is electrically connected to the drain region 3 via the drain contact plug 14.

Like the lower electrode 19, the upper electrode 21 is made of a conductive material that contains a noble metal. The upper electrode 21 has the same thickness (for example, 0.05 to 0.2 μm) as, for example, the lower electrode 19.

The ferroelectric film 20 is made of a ferroelectric material. No specific limitations are imposed on the ferroelectric material if the ferroelectric material has properties capable of storing an electric charge even when a voltage is not applied, and well-known materials, such as lead zirconate titanate (Pb(Zr, Ti) O$_3$: PZT), strontium bismuth tantalate (SrBi$_2$Ta$_2$O$_9$: SBT), bismuth lanthanum titanate (Bi,La)$_4$Ti$_3$O$_{12}$: BLT), and barium titanate (BaTiO$_3$), can be mentioned as the ferroelectric material. The thickness of the ferroelectric film 20 is, for example, 0.05 to 0.2 μm.

The ferroelectric capacitor 18 having a layered structure consisting of the lower electrode 19, the ferroelectric film 20, and the upper electrode 21 is formed in, for example, a mesa shape (i.e., trapezoidal shape when viewed cross-sectionally). A side surface 64 of the ferroelectric capacitor 18 is a steeply oblique surface that is inclined at an inclination angle of "a" (for example, a=75 to 85° with respect to a stacked-layer interface I located on the opening 17.

A TiN film 48 is stacked on the upper electrode 21 of the ferroelectric capacitor 18.

A first hydrogen barrier film 22 made of Al$_2$O$_3$ (alumina) and a second hydrogen barrier film 23 made of SiN (silicon nitride) are sequentially stacked on the interlayer insulating film 16.

The second insulating layer 24 is stacked on the second hydrogen barrier film 23. The second insulating layer 24 is made of, for example, silicon oxide. The second insulating layer 24 has the same thickness (e.g., 0.4 to 0.9 µm) as, for example, the first insulating layer 9.

The second insulating layer 24, the second hydrogen barrier film 23, and the first hydrogen barrier film 22 have a PL wiring via-hole 25 that penetrates therethrough from the upper surface 65 of the second insulating layer 24 and that reaches the TiN film 48.

A PL wiring plug 29 made of a metallic material, such as tungsten, is embedded in the PL wiring via-hole 25. The PL wiring via-hole 25 is filled with the PL wiring plug 29 until its upper surface 66 becomes flush with the upper surface 65 of the second insulating layer 24.

In the PL wiring via-hole 25, a barrier film 27 is interposed between its inner surface (i.e., the side surface formed by the second insulating layer 24 and the bottom surface formed by the TiN film 48) and the PL wiring plug 29. The barrier film 27 is made of, for example, a conductive material (for example, TiN, Ti, etc.) that contains titanium.

The electrically-conductive barrier film 27 is interposed therebetween, and, as a result, the PL wiring plug 29 is brought into electric contact with the upper electrode 21 via the barrier film 27 and the TiN film 48.

The second insulating layer 24, the second hydrogen barrier film 23, and the first hydrogen barrier film 22 have a BL wiring via-hole 26 that penetrates therethrough from the upper surface 65 of the second insulating layer 24 and that reaches the source contact plug 15.

A BL wiring plug 30 made of a metallic material, such as tungsten, is embedded in the BL wiring via-hole 26. The BL wiring via-hole 26 is filled with the BL wiring plug 30 until its upper surface 67 becomes flush with the upper surface 65 of the second insulating layer 24.

In the BL wiring via-hole 26, a barrier film 28 is formed between its inner surface (the side surface formed by the second insulating layer 24 and the bottom surface formed by the source contact plug 15) and the BL wiring plug 30. The barrier film 28 is made of, for example, a conductive material (for example, TiN, Ti, etc.) that contains titanium.

The electrically-conductive barrier film 28 is interposed therebetween, and, as a result, the BL wiring plug 30 is brought into electric contact with the source contact plug 15 via the barrier film 27.

A PL wiring 31 and a BL wiring 32 are formed on the second insulating layer 24.

The PL wiring 31 is a wiring to be connected to a plate line 40 of the ferroelectric memory 1, and has a three-layer structure that consists of, for example, a titanium layer 33 made of a conductive material that contains titanium, an aluminum layer 34 made of a conductive material that contains aluminum, and a titanium layer 35 made of a conductive material that contains titanium.

The BL wiring 32 is a wiring to be connected to a bit line 41 of the ferroelectric memory 1, and has a three-layer structure that consists of, for example, a titanium layer 36 made of a conductive material that contains titanium, an aluminum layer 37 made of a conductive material that contains aluminum, and a titanium layer 38 made of a conductive material that contains titanium.

The ferroelectric memory 1 is provided with a word line 39, the plate line 40, and the bit line 41.

The word line 39 extends in a direction perpendicular to the longitudinal direction of the active region 50 at a position that faces each channel region placed between the drain region 3 and the source region 4. The word line 39 is connected to the gate electrode 6.

The plate line 40 extends in the direction perpendicular to the longitudinal direction of the active region 50 above the upper electrode 21. The plate line 40 is connected to the PL wiring 31.

The bit line 41 extends in the longitudinal direction of the active region 50 above the active region 50. The bit line 41 is connected to the BL wiring 32.

A memory cell is selected by the word line 39, and a voltage is applied between the bit line 41 and the plate line 40, and, as a result, the ferroelectric capacitor 18 of the selected memory cell is polarized in a direction leading from the upper electrode 21 to the lower electrode 19 or in a direction opposite to this direction. One-bit information (i.e., information of 0 or 1) can be written onto this memory cell by determining this polarization direction.

On the other hand, in each memory cell, a pulse voltage is applied between the upper electrode 21 and the lower electrode 19, and the one-bit information written onto that memory cell is determined by the presence or absence of an electric current caused by a polarization inversion of the ferroelectric capacitor 18, and, accordingly, this information can be read.

FIG. 3A to FIG. 3J are schematic sectional views shown in process sequence of a method for manufacturing the ferroelectric memory of FIG. 2.

Figure 3A:
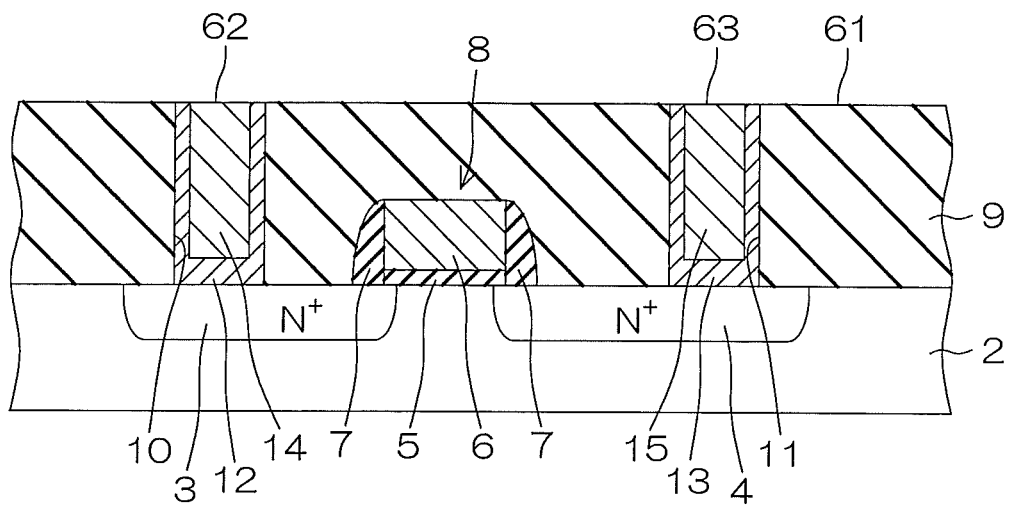
FIG. 3A is a schematic sectional view of a method for manufacturing the ferroelectric memory of FIG. 2 shown in process sequence.

In this manufacturing method, first, an N type impurity is injected into a surface part of the silicon substrate 2, and, as a result, an N$^+$ type drain region 3 and an N$^+$ type source region 4 are formed as shown in FIG. 3A. Thereafter, a thermally-oxidized film (not shown) is formed on the silicon substrate 2 by thermal oxidation treatment, and is subjected to patterning. As a result, a gate insulating film 5 that extends like a bridge between the drain region 3 and the source region 4 is formed.

Thereafter, by the CVD method, polysilicon (i.e., doped polysilicon) doped with an impurity is deposited on the silicon substrate 2 having the gate insulating film 5, and is subjected to patterning. As a result, a gate electrode 6 is formed on the gate insulating film 5. Thereafter, by the CVD method, silicon oxide is deposited on the silicon substrate 2, and is subjected to etchback. As a result, a sidewall 7 that surrounds the side wall of the gate electrode 6 is formed. In this way, a MOSFET 8 having the gate electrode 6 (Metal), the gate insulating film 5 (Oxide), and the silicon substrate 2 (Semiconductor) including the drain region 3 and the source region 4 is formed as shown in FIG. 3A.

After forming the MOSFET 8, silicon oxide is deposited on the silicon substrate 2 by the CVD method, and, as a result, a first insulating layer 9 is formed. Thereafter, by a well-known patterning technique, the first insulating layer 9 is subjected to patterning, and, as a result, a drain contact hole 10 and a source contact hole 11 are simultaneously formed in the first insulating layer 9.

Thereafter, by the sputtering method, a conductive material that contains titanium is deposited such that the whole of the inner surface of the drain contact hole 10 and that of the source contact holes 11 are covered therewith and such that the upper surface 61 of the first insulating layer 9 is covered therewith. Thereafter, by the CVD method, tungsten is deposited such that the drain contact hole 10 and the source contact hole 11 are filled therewith. Thereafter, the conductive material that contains titanium and the tungsten material are polished by CMP treatment until the upper surface of the tungsten material deposited thereon and the upper surface 61 of the first insulating layer 9 become flush with each other. In this way, a barrier film 12 is formed, and a drain contact plug 14 embedded in the drain contact hole 10 is formed via the barrier film 12 as shown in FIG. 3A. Furthermore, a barrier film 13 is formed, and a source contact plug 15 embedded in the source contact hole 11 is formed simultaneously with the drain contact plug 14 via the barrier film 13. The upper surface 62 of the drain contact plug 14 and the upper surface 63 of the source contact plug 15 become flush with the upper surface 61 of the first insulating layer 9.

Figure 3B:
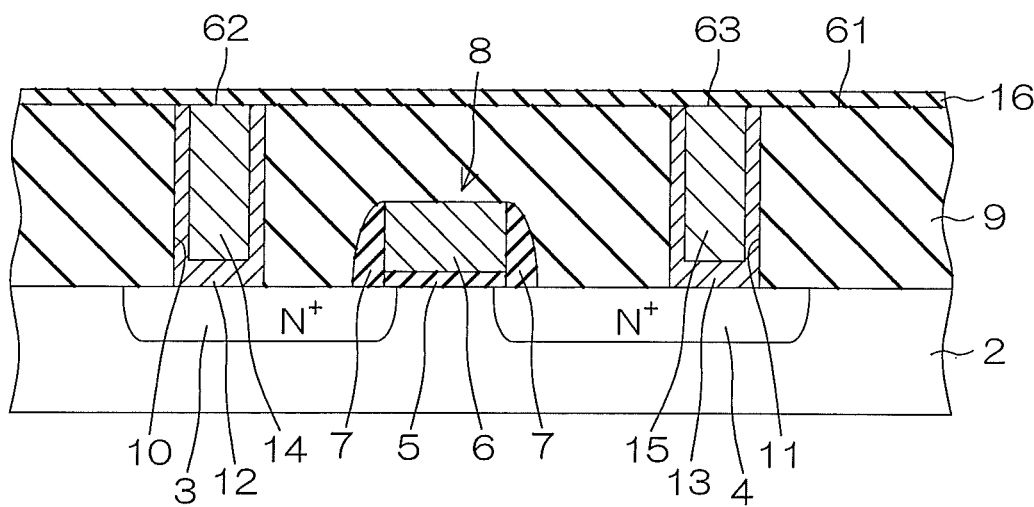
FIG. 3B is a sectional view showing a step subsequent to that of FIG. 3A.

Thereafter, by the CVD method, silicon oxide is deposited on the first insulating layer 9, and, as a result, an interlayer insulating film 16 is stacked on the first insulating layer 9 as shown in FIG. 3B.

Figure 3C:
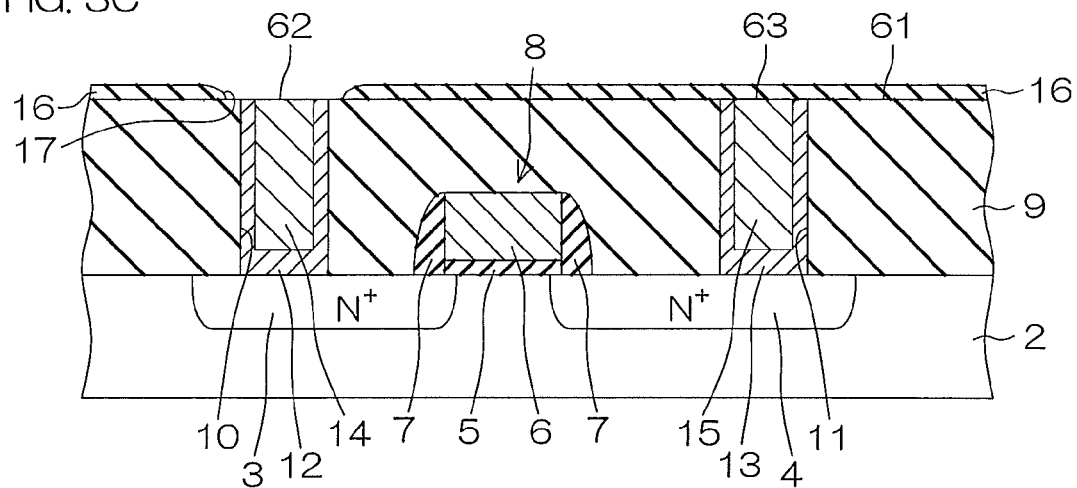
FIG. 3C is a sectional view showing a step subsequent to that of FIG. 3B.

Thereafter, a part of the interlayer insulating film 16 that faces the drain contact plug 14 is removed by a well-known patterning technique. As a result, an opening 17 by which the upper surface 62 of the drain contact plug 14 is exposed is formed as shown in FIG. 3C.

Figure 3D:
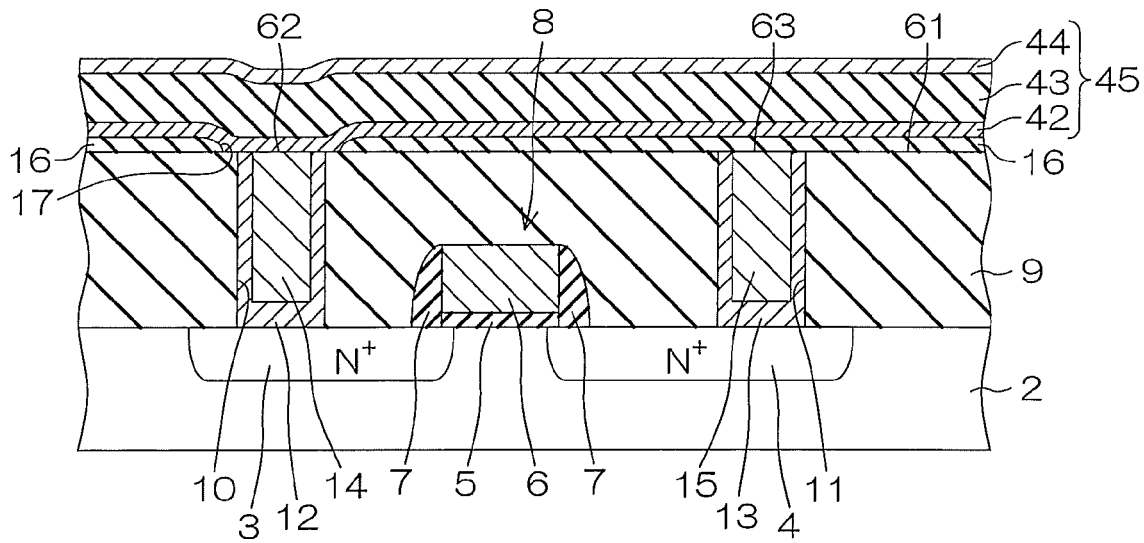
FIG. 3D is a sectional view showing a step subsequent to that of FIG. 3C.

Thereafter, by the sputtering method, a lower conductive material film 42 made of a conductive material that contains a noble metal, a ferroelectric material film 43 made of a ferroelectric material, and an upper conductive material film 44 made of a conductive material that contains a noble metal are sequentially deposited on the interlayer insulating film 16, and, as a result, a deposit structure 45 is formed as shown in FIG. 3D.

Figure 3E:
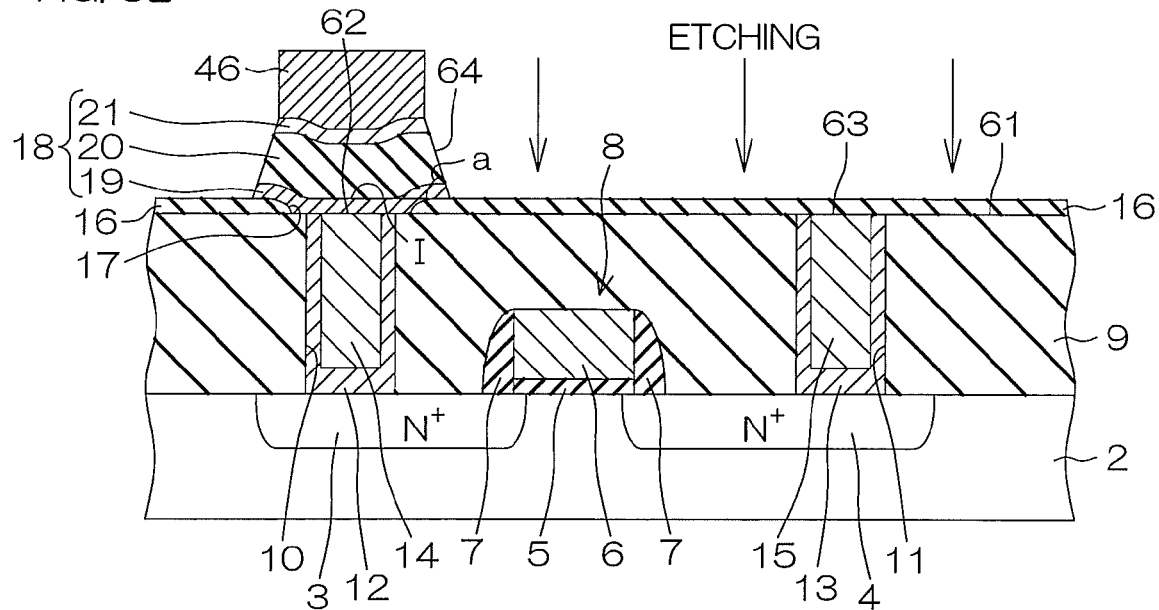
FIG. 3E is a sectional view showing a step subsequent to that of FIG. 3D.
Figure 3F:
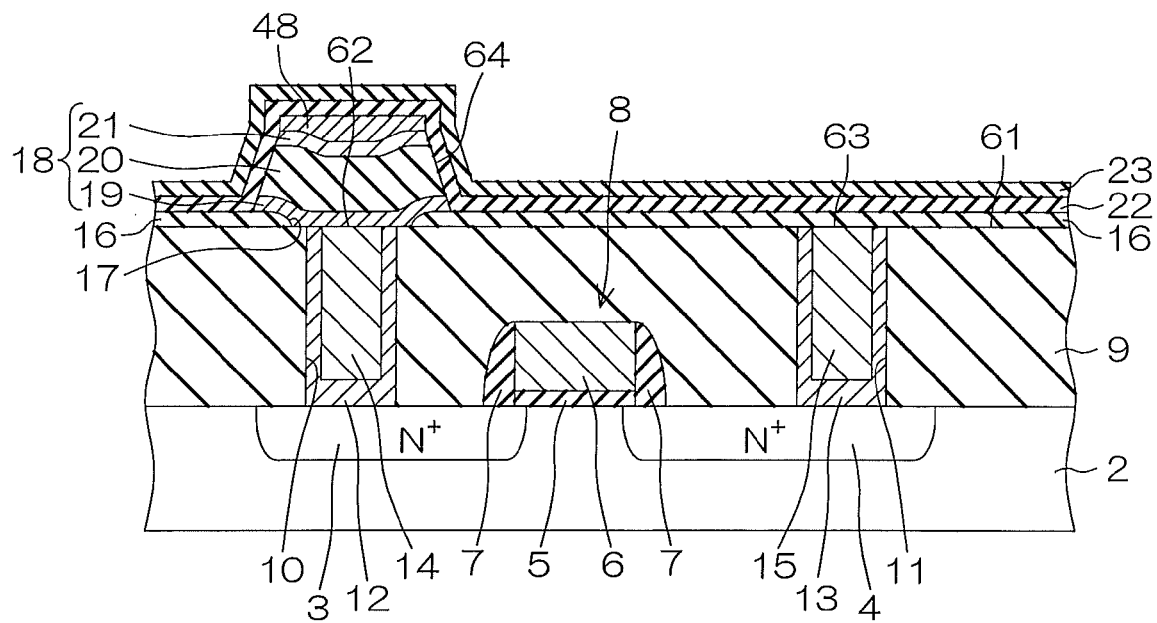
FIG. 3F is a sectional view showing a step subsequent to that of FIG. 3E.

Thereafter, a hard mask 46 having heat-resisting properties (for example, TiN) is formed at apart of the deposit structure 45 located on the opening 17 (i.e., a part located on the drain contact plug 14). Thereafter, the deposit structure 45 is etched vertically with respect to its stacked-layer interface at an etching temperature of, for example, 300° C. or more, and, preferably, at an etching temperature of 350 to 450° C. via the hard mask 46. As a result, in such a way that the part of the deposit structure 45 located on the opening 17 remains there, the other parts of the deposit structure 45 except the remaining part are removed. In this way, the mesa-shaped ferroelectric capacitor 18 having the side surface 64 that is inclined at an inclination angle of "a" (for example, a=75 to 85° with respect to the stacked-layer interface I on the opening 17 is formed as shown in FIG. 3E. As shown in FIG. 3F, the hard mask 46 that has been thinned by etching remains as the TiN film 48 on the upper electrode 21 of the ferroelectric capacitor 18.

Thereafter, $Al_2O_3$ (alumina) is deposited on the interlayer insulating film 16 by the sputtering method, and SiN (silicon nitride) is deposited thereon by the PECVD method. As a result, as shown in FIG. 3F, a first hydrogen barrier film 22 and a second hydrogen barrier film 23 are formed such that the interlayer insulating film 16 is covered therewith and such that the whole of the surface of the ferroelectric capacitor 18 is covered therewith.

Figure 3G:
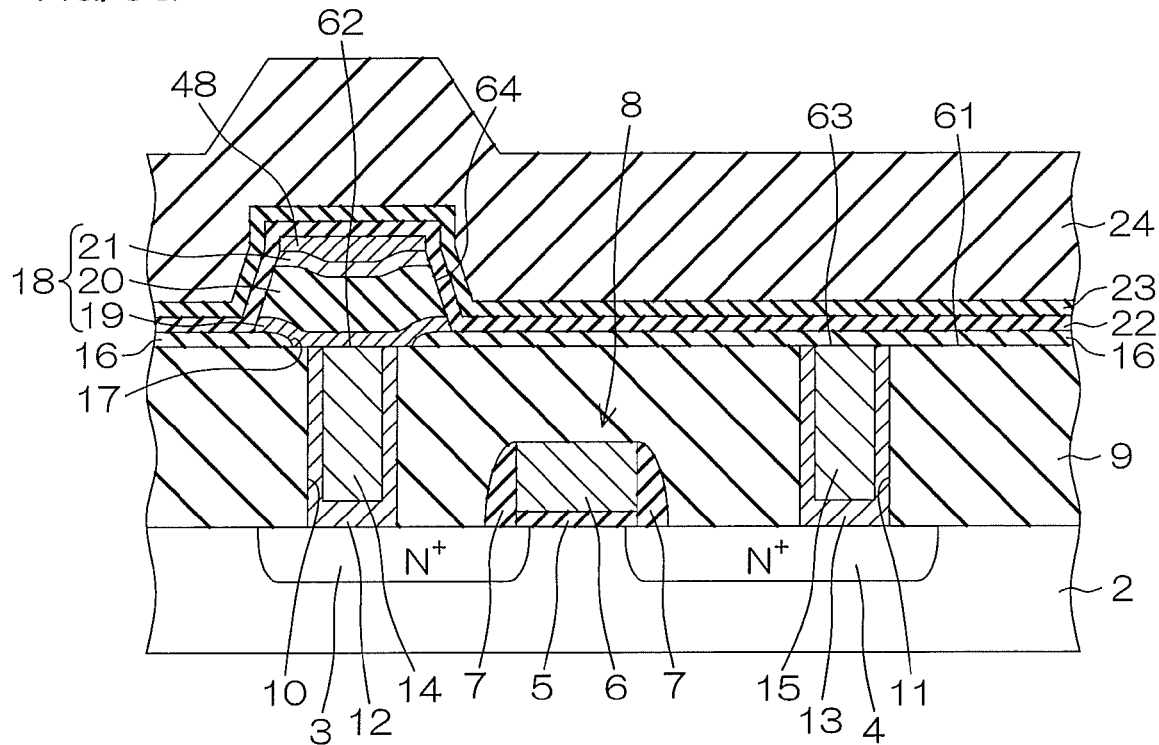
FIG. 3G is a sectional view showing a step subsequent to that of FIG. 3F.

Thereafter, by the CVD method, a second insulating layer 24 made of silicon oxide is stacked on the second hydrogen barrier film 23 as shown in FIG. 3G. At this time, the whole of the surface of the ferroelectric capacitor 18 is covered with the first hydrogen barrier film 22 and the second hydrogen barrier film 23, and therefore the reduction of oxygen in the ferroelectric film 20 by carrier gas can be prevented even if the CVD method in which H (hydrogen) is used as the carrier gas is employed as a method for forming the second insulating layer 24. Therefore, a deterioration in properties of the ferroelectric film 20 can be restrained.

Figure 3H:
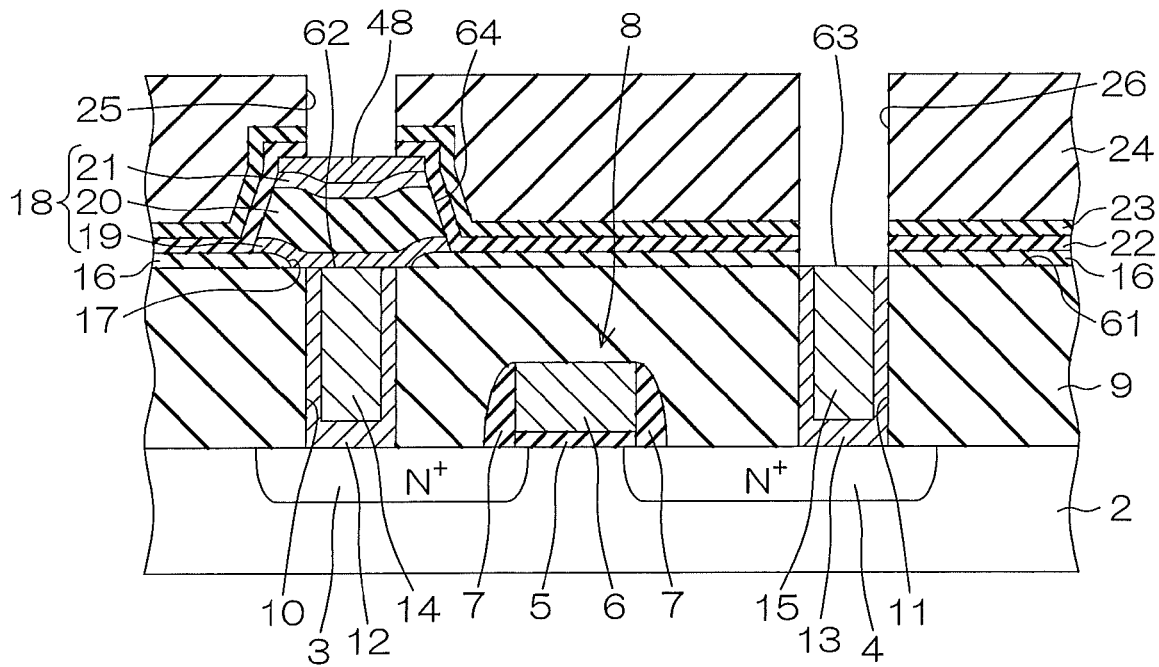
FIG. 3H is a sectional view showing a step subsequent to that of FIG. 3G.
Figure 3:
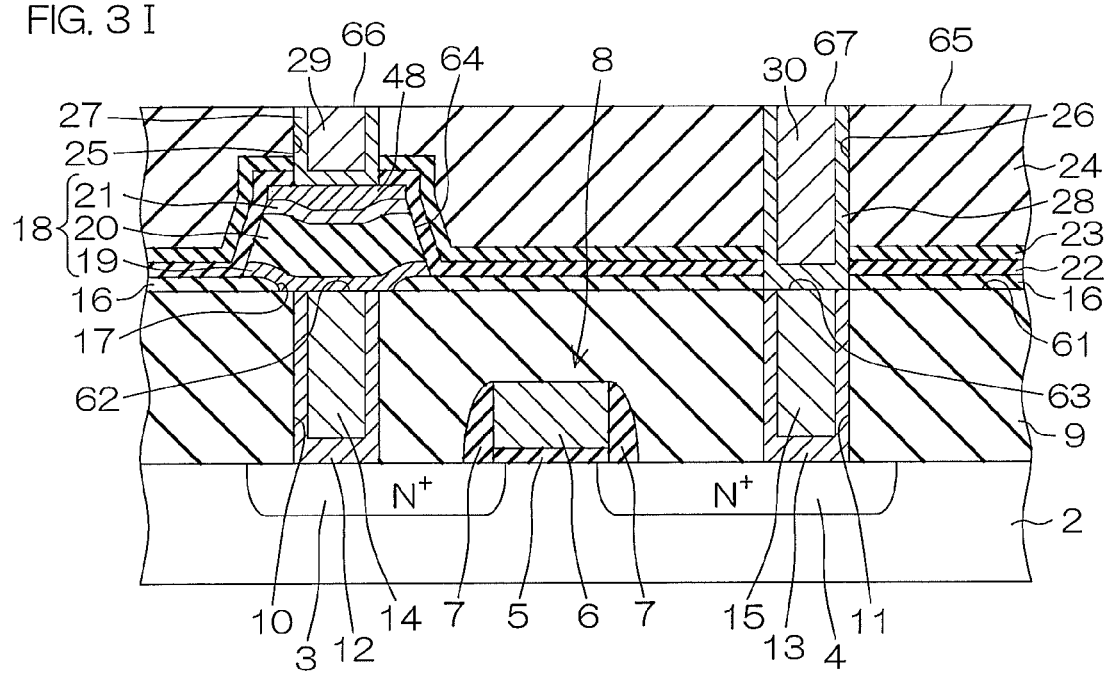
FIG. 3I is a sectional view showing a step subsequent to that of FIG. 3H.
FIG. 3J is a sectional view showing a step subsequent to that of FIG. 3I.

Thereafter, the second insulating layer 24 is polished by CMP treatment, and the surface of the second insulating layer 24 is flattened. Thereafter, as shown in FIG. 3H, the second insulating layer 24, the second hydrogen barrier film 23, and the first hydrogen barrier film 22 are subjected to patterning by a well-known patterning technique, and, as a result, a PL wiring via-hole 25 by which the TiN film 48 is exposed and a BL wiring via-hole 26 by which the upper surface 63 of the source contact plug 15 is exposed are formed simultaneously.

Thereafter, by the sputtering method, a conductive material that contains titanium is deposited such that the inner surface of the PL wiring via-hole 25 and that of the BL wiring via-hole 26 are covered therewith and such that the upper surface 65 of the second insulating layer 24 is covered therewith. Thereafter, by the CVD method, tungsten is deposited such that the PL wiring via-hole 25 and the BL wiring via-hole 26 are filled therewith. Thereafter, the conductive material that contains titanium and the tungsten material are polished by CMP treatment until the upper surface of the tungsten material and the upper surface 65 of the second insulating layer 24 become flush with each other. In this way, a barrier film 27 is formed, and a PL wiring plug 29 embedded in the PL wiring via-hole 25 is formed via the barrier film 27 as shown in FIG. 3I. Furthermore, a barrier film 28 is formed, and a BL wiring plug 30 embedded in the BL wiring via-hole 26 is formed simultaneously with the PL wiring plug 29 via the barrier film 28. The upper surface 66 of the PL wiring plug 29 and the upper surface 67 of the BL wiring plug 30 become flush with the upper surface 65 of the second insulating layer 24.

Thereafter, by the sputtering method, a conductive material that contains titanium, a conductive material that contains aluminum, and a conductive material that contains titanium are stacked on the second insulating layer 24, and are subjected to patterning. As a result, a PL wiring 31 (i.e., a wiring that has a three-layer structure consisting of a titanium layer 33, an aluminum layer 34, and a titanium layer 35) that is brought into electric contact with the PL wiring plug 29 and a BL wiring 32 (i.e., a wiring that has a three-layer structure consisting of a titanium layer 36, an aluminum layer 37, and a titanium layer 38) that is brought into electric contact with the BL wiring plug 30 are simultaneously formed as shown in FIG. 3J.

Thereafter, the word line 39 is connected to the gate electrode 6, and the plate line 40 is connected to the PL wiring 31, and the bit line 41 is connected to the BL wiring 32.

Figure 3J:
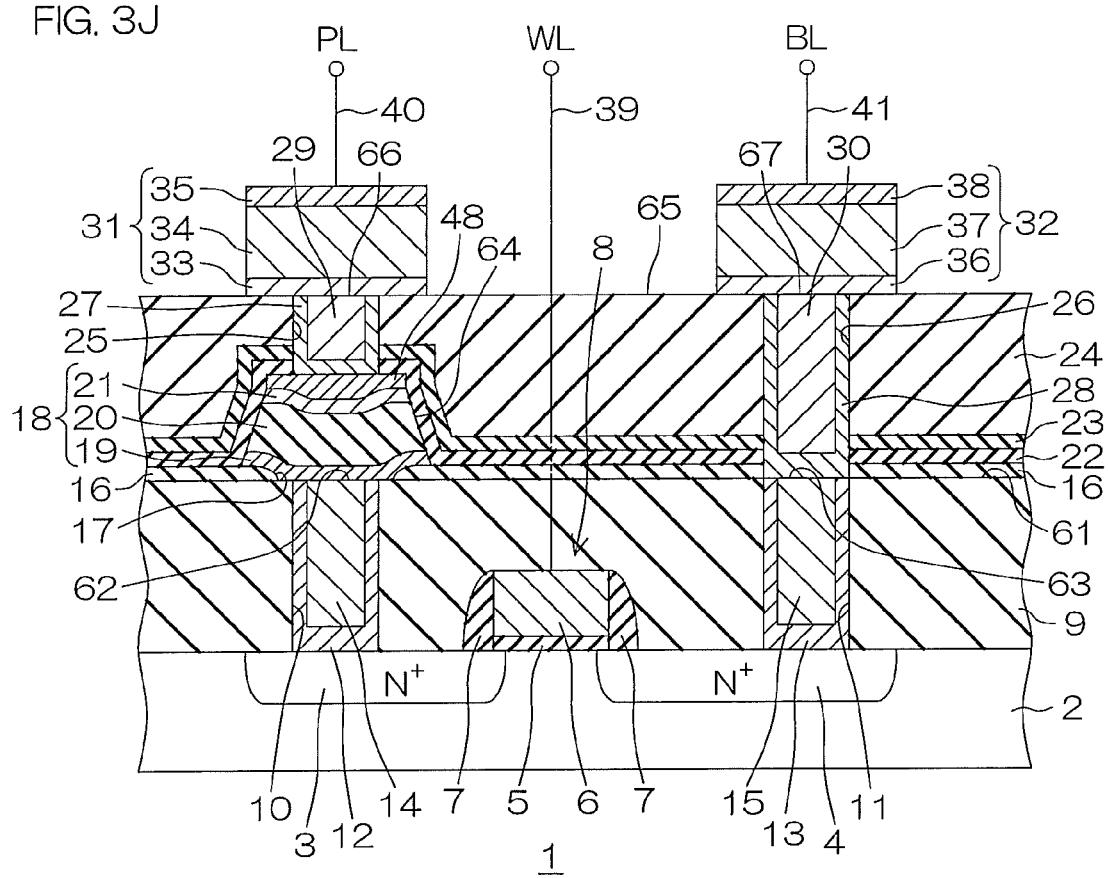

In this way, a ferroelectric memory 1 including the ferroelectric capacitor 18 can be obtained as shown in FIG. 3J.

As described above, in the above-mentioned manufacturing method, the drain contact plug 14 and the source contact plug 15 are embedded in the first insulating layer 9, and then the interlayer insulating film 16 is stacked on the first insulating layer 9. Thereafter, the interlayer insulating film 16 is subjected to patterning, and the part of the interlayer insulating film 16 that faces the drain contact plug 14 is removed, and, as a result, the opening 17 is formed. As a result, the drain contact plug 14 is exposed via the opening 17 of the interlayer insulating film 16, whereas the source contact plug 15 is covered with the interlayer insulating film 16.

Under this condition, the deposit structure 45 is formed on the interlayer insulating film 16, and the hard mask 46 having heat-resisting properties is formed at the part of the deposit structure 45 (i.e., the part thereof on the opening 17). Thereafter, the deposit structure 45 is etched via the hard mask 46, and, as a result, the ferroelectric capacitor 18 is formed.

When the deposit structure 45 is etched, the source contact plug 15 is covered with the interlayer insulating film 16. Therefore, as described above, protection given by the interlayer insulating film 16 makes it possible to prevent the source contact plug 15 from being abnormally etched even if the deposit structure 45 is etched at a high temperature of 300° C.

or more. As a result, it is possible to inhibit the occurrence of an electrical conduction failure between the source contact plug 15 and the BL wiring plug 30 connected to this source contact plug 15, and it is possible to restrain a decrease in reliability.

Additionally, the deposit structure 45 is etched at a high temperature, and therefore the side surface 64 of the ferroelectric capacitor 18 can be formed to be a steeply oblique surface with respect to the stacked-layer interface I located on the opening 17. As a result, the area of the ferroelectric capacitor 18 can be reduced, and therefore the ferroelectric memory 1 can be miniaturized.

Additionally, with regard to the formation of the drain contact plug 14 and the source contact plug 15, the drain contact hole 10 and the source contact hole 11 are formed simultaneously. Thereafter, tungsten is deposited such that these contact holes are filled therewith, and is then polished by CMP treatment until the upper surface of the tungsten material and the upper surface 61 of the first insulating layer 9 become flush with each other. The drain contact plug 14 and the source contact plug 15 whose upper surfaces 62 and 63, respectively, are made flush with each other by this polishing treatment are formed simultaneously (see FIG. 3A).

A plurality of steps of forming the drain contact plug 14 and a plurality of steps of forming the source contact plug 15 are performed in parallel with each other as described above, and therefore the manufacturing process of the ferroelectric memory 1 can be simplified.

Figure 4:
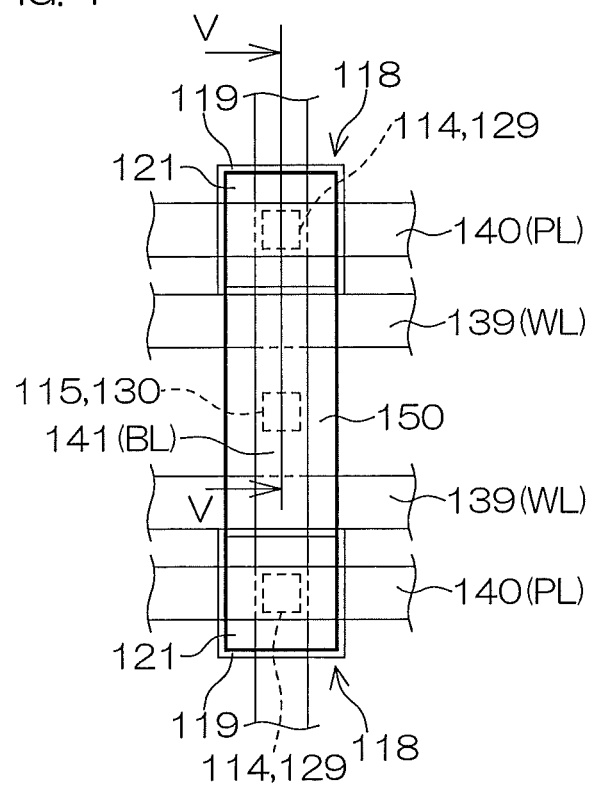
FIG. 4 is a schematic plan view of a ferroelectric memory according to a second embodiment of the present invention.
Figure 5:
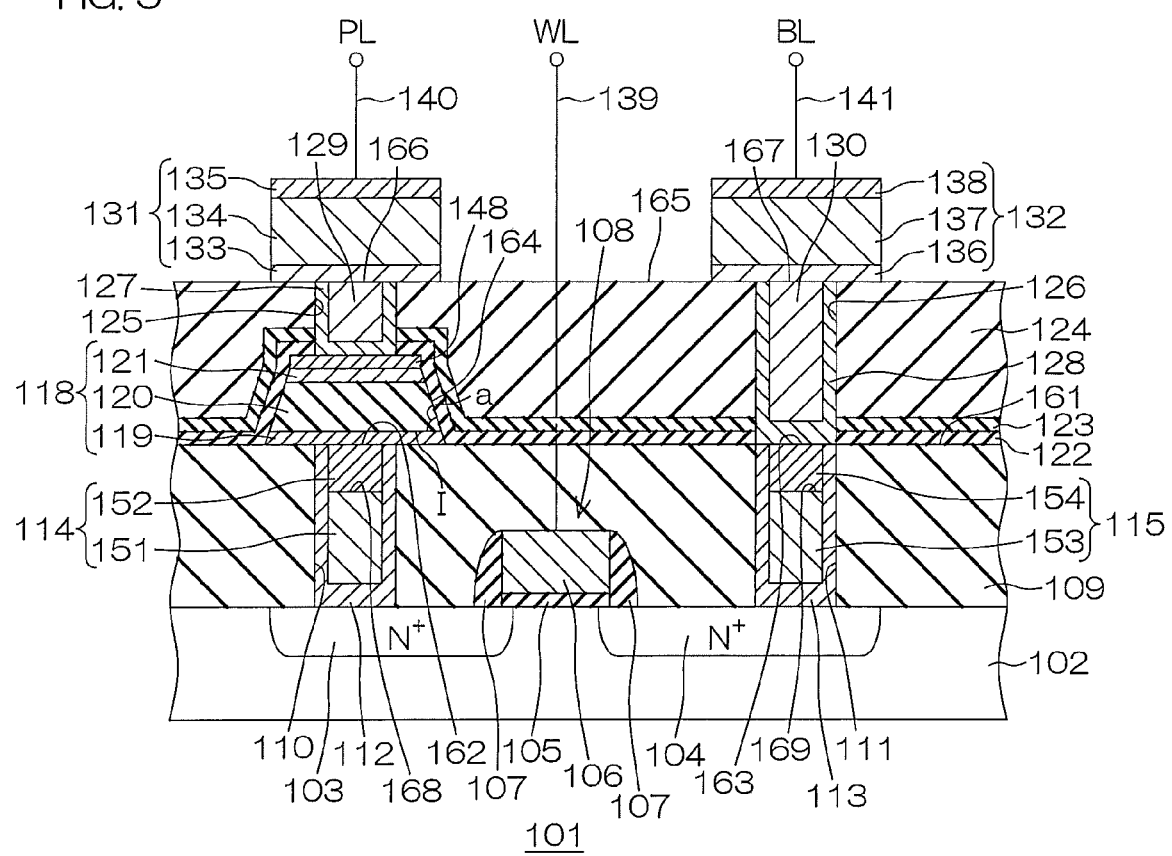
FIG. 5 is a sectional view of the ferroelectric memory of FIG. 4 along cutting-plane line V-V.

FIG. 4 is a schematic plan view of a ferroelectric memory according to a second embodiment of the present invention. FIG. 5 is a sectional view of the ferroelectric memory of FIG. 4 along cutting-plane line V-V.

A ferroelectric memory 101 serving as a semiconductor storage device is a nonvolatile memory capable of retaining its memory contents even when a power supply is turned off.

The ferroelectric memory 101 includes a P type silicon substrate 102 as shown in FIG. 5.

For example, a plurality of active regions 150, each of which has a rectangular shape when viewed planarly, are formed on the silicon substrate 102. The outline of the active region 150 is shown by a heavy line in FIG. 4. The active regions 150 are arrayed in a matrix manner so as to be arrayed in its longitudinal direction and in a direction perpendicular to the longitudinal direction.

Each of the active regions 150 has a plurality of memory cells (two memory cells in this embodiment) each of which retains one-bit information. One of the memory cells is shown in FIG. 5.

Each memory cell has a 1T1C-type cell structure in which one ferroelectric capacitor (C) 118 and one MOSFET (T) 108 are arranged so as to have a stacked-layer relationship.

As shown in FIG. 5, in the active region 150 (i.e., in each memory cell), an N$^+$ type drain region 103 and an N$^+$ type source region 104 are formed with a gap therebetween at a surface part of the silicon substrate 102. The source region 104 is used as a region shared with the MOSFETs 108 of the two memory cells, and is formed in the center part of the active region 150 when viewed planarly. On the other hand, in correlation with the MOSFET 108 of each memory cell, the drain region 103 is formed at one end of the active region 150 and at the other end thereof when viewed planarly.

Additionally, a gate insulating film 105 that extends like a bridge from the drain region 103 to the source region 104 is formed on the surface of the silicon substrate 102. The gate insulating film 105 is made of, for example, silicon oxide.

A gate electrode 106 made of, for example, polysilicon (i.e., doped polysilicon) doped with an impurity is formed on the gate insulating film 105.

A sidewall 107 is formed on the side wall of the gate electrode 106 in such a manner as to be in close contact therewith over its whole circumference. The sidewall 107 is made of, for example, silicon oxide.

In this way, the ferroelectric memory 101 has the MOSFET 108 that includes the gate electrode (i.e., metal) 106, the gate insulating film (i.e., oxide) 105, and the silicon substrate (i.e., semiconductor) 102 including the drain region 103 and the source region 104.

A first insulating layer 109 is stacked on the silicon substrate 102. The first insulating layer 109 is made of, for example, silicon oxide. The thickness of the first insulating layer 109 is, for example, 0.4 to 0.9 μm.

A drain contact hole 110 that leads from the upper surface 161 of the first insulating layer 109 to the drain region 103 is formed at a part of the first insulating layer 109 that faces the drain region 103.

A drain contact plug 114 is embedded in the drain contact hole 110. The drain contact plug 114 includes a main plug 151 buried to a middle part in the depth direction of the drain contact hole 110 and a cap plug 152 with which the upper surface 168 of the main plug 151 is covered and with which the drain contact hole 110 is filled until its upper surface 162 becomes flush with the upper surface 161 of the first insulating layer 109.

The main plug 151 serving as a first metal plug is made of, for example, a metallic material such as tungsten.

The cap plug 152 serving as an electrically-conductive cap is made of a conductive material, such as conductive nitride (e.g., TiN (titanium nitride), TaN (tantalum nitride), WN (tungsten nitride), etc.), polysilicon (doped polysilicon) doped with an impurity, or carbon, which has an etching selection ratio with respect to the material for a lower electrode 119 and that of an upper electrode 121 described later.

In the drain contact hole 110, a barrier film 112 is interposed between its inner surface (i.e., the side surface formed by the first insulating layer 109 and the bottom surface formed by the silicon substrate 102) and the drain contact plug 114. The barrier film 112 is made of, for example, a conductive material (e.g., TiN, Ti, etc.) that contains titanium.

The electrically-conductive barrier film 112 is interposed therebetween, and, as a result, the drain contact plug 114 is brought into electric contact with the drain region 103 via the barrier film 112.

A source contact hole 111 that leads from the upper surface 161 of the first insulating layer 109 to the source region 104 is formed at a part of the first insulating layer 109 that faces the source region 104.

A source contact plug 115 is embedded in the source contact hole 111. The source contact plug 115 includes a main plug 153 buried to a middle part in the depth direction of the source contact hole 111 and a cap plug 154 with which the upper surface 169 of the main plug 153 is covered and with which the source contact hole 111 is filled until its upper surface 163 becomes flush with the upper surface 161 of the first insulating layer 109. The upper surface 163 of the cap plug 154 is flush with the upper surface 161 of the first insulating layer 109, and, as a result, the upper surface of the source contact plug 115 (i.e., the upper surface 163 of the cap plug 154) and the upper surface of the drain contact plug 114 (i.e., the upper surface 162 of the cap plug 152) are flush with each other.

The main plug 153 serving as a second metal plug is made of, for example, a metallic material such as tungsten.

The cap plug 154 serving as an electrically-conductive cap is made of, for example, the same material as the above-mentioned cap plug 152.

In the source contact hole 111, a barrier film 113 is interposed between its inner surface (i.e., the side surface formed by the first insulating layer 109 and the bottom surface formed by the silicon substrate 102) and the source contact plug 115. The barrier film 113 is made of, for example, a conductive material (e.g., TiN, Ti, etc.) that contains titanium.

The conductive barrier film 113 is interposed therebetween, and, as a result, the source contact plug 115 is brought into electric contact with the source region 104 via the barrier film 113.

The ferroelectric capacitor 118 is disposed on the first insulating layer 109 at a part of the first insulating layer 109 that faces the drain contact plug 114. In other words, the ferroelectric capacitor 118 is disposed, when viewed planarly, at a position at which the ferroelectric capacitor 118 lies on the drain contact plug 114 and at which the ferroelectric capacitor 118 does not lie on the source contact plug 115.

The ferroelectric capacitor 118 includes a lower electrode 119, an upper electrode 121, and a ferroelectric film 120 placed between the lower electrode 119 and the upper electrode 121.

The lower electrode 119 is made of a conductive material that contains a noble metal (specifically, Au-based material, Ag-based material, Pt-based material, Pd-based material, Rh-based material, Ir-based material, Ru-based material, and Os-based material). The thickness of the lower electrode 119 is, for example, 0.05 to 0.25 µm. The lower electrode 119 is in contact with the upper surface 162 of the drain contact plug 114. As a result, the lower electrode 119 is electrically connected to the drain region 103 via the drain contact plug 114.

Like the lower electrode 119, the upper electrode 121 is made of a conductive material that contains a noble metal. The upper electrode 121 has the same thickness (for example, 0.05 to 0.25 µm) as, for example, the lower electrode 119.

The ferroelectric film 120 is made of a ferroelectric material. No specific limitations are imposed on the ferroelectric material if the ferroelectric material has properties capable of storing an electric charge even when a voltage is not applied, and well-known materials, such as lead zirconate titanate (Pb(Zr, Ti)O$_3$: PZT), strontium bismuth tantalate (SrBi$_2$Ta$_2$O$_9$: SBT), bismuth lanthanum titanate (Bi,La)$_4$Ti$_3$O$_{12}$: BLT), and barium titanate (BaTiO$_3$), can be mentioned as the ferroelectric material. The thickness of the ferroelectric film 120 is, for example, 0.1 to 0.2 µm.

The ferroelectric capacitor 118 having a layered structure consisting of the lower electrode 119, the ferroelectric film 120, and the upper electrode 121 is formed in, for example, a mesa shape (i.e., trapezoidal shape when viewed cross-sectionally). A side surface 164 of the ferroelectric capacitor 118 is a steeply oblique surface that is inclined at an inclination angle of "a" (for example, a=75 to 85° with respect to its stacked-layer interface I.

A TiN film 148 is stacked on the upper electrode 121 of the ferroelectric capacitor 118.

A first hydrogen barrier film 122 made of Al$_2$O$_3$ (alumina) and a second hydrogen barrier film 123 made of SiN (silicon nitride) are sequentially stacked on the first insulating layer 109.

A second insulating layer 124 is stacked on the second hydrogen barrier film 123. The second insulating layer 124 is made of, for example, silicon oxide. The second insulating layer 124 has the same thickness (e.g., 0.4 to 0.9 µm) as, for example, the first insulating layer 109.

The second insulating layer 124, the second hydrogen barrier film 123, and the first hydrogen barrier film 122 have a PL wiring via-hole 125 that penetrates therethrough from the upper surface 165 of the second insulating layer 124 and that reaches the TiN film 148.

A PL wiring plug 129 made of a metallic material, such as tungsten, is embedded in the PL wiring via-hole 125. The PL wiring via-hole 125 is filled with the PL wiring plug 129 until its upper surface 166 becomes flush with the upper surface 165 of the second insulating layer 124.

In the PL wiring via-hole 125, a barrier film 127 is interposed between its inner surface (i.e., the side surface formed by the second insulating layer 124 and the bottom surface formed by the TiN film 148) and the PL wiring plug 129. The barrier film 127 is made of, for example, a conductive material (for example, TiN, Ti, etc.) that contains titanium.

The conductive barrier film 127 is interposed therebetween, and, as a result, the PL wiring plug 129 is brought into electric contact with the upper electrode 121 via the barrier film 127 and the TiN film 148.

The second insulating layer 124, the second hydrogen barrier film 123, and the first hydrogen barrier film 122 have a BL wiring via-hole 126 that penetrates therethrough from the upper surface 165 of the second insulating layer 124 and that reaches the source contact plug 115.

A BL wiring plug 130 made of a metallic material, such as tungsten, is embedded in the BL wiring via-hole 126. The BL wiring via-hole 126 is filled with the BL wiring plug 130 until its upper surface 167 becomes flush with the upper surface 165 of the second insulating layer 124.

In the BL wiring via-hole 126, a barrier film 128 is formed between its inner surface (the side surface formed by the second insulating layer 124 and the bottom surface formed by the source contact plug 115) and the BL wiring plug 130. The barrier film 128 is made of, for example, a conductive material (for example, TiN, Ti, etc.) that contains titanium.

The conductive barrier film 128 is interposed therebetween, and, as a result, the BL wiring plug 130 is brought into electric contact with the source contact plug 115 via the barrier film 127.

A PL wiring 131 and a BL wiring 132 are formed on the second insulating layer 124.

The PL wiring 131 is a wiring to be connected to a plate line 140 of the ferroelectric memory 101, and has a three-layer structure that consists of, for example, a titanium layer 133 made of a conductive material that contains titanium, an aluminum layer 134 made of a conductive material that contains aluminum, and a titanium layer 135 made of a conductive material that contains titanium.

The BL wiring 132 is a wiring to be connected to a bit line 141 of the ferroelectric memory 101, and has a three-layer structure that consists of, for example, a titanium layer 136 made of a conductive material that contains titanium, an aluminum layer 137 made of a conductive material that contains aluminum, and a titanium layer 138 made of a conductive material that contains titanium.

The ferroelectric memory 101 is provided with a word line 139, the plate line 140, and the bit line 141.

The word line 139 extends in a direction perpendicular to the longitudinal direction of the active region 150 at a position that faces each channel region placed between the drain region 103 and the source region 104. The word line 139 is connected to the gate electrode 106.

The plate line 140 extends in the direction perpendicular to the longitudinal direction of the active region 150 above the upper electrode 121. The plate line 140 is connected to the PL wiring 131.

The bit line 141 extends in the longitudinal direction of the active region 150 above the active region 150. The bit line 141 is connected to the BL wiring 132.

A memory cell is selected by the word line 139, and a voltage is applied between the bit line 141 and the plate line 140, and, as a result, the ferroelectric capacitor 118 of the selected memory cell is polarized in a direction leading from the upper electrode 121 to the lower electrode 119 or in a direction opposite to this direction. One-bit information (i.e., information of 0 or 1) can be written onto this memory cell by determining this polarization direction.

On the other hand, in each memory cell, a pulse voltage is applied between the upper electrode 121 and the lower electrode 119, and the one-bit information written onto that memory cell is determined by the presence or absence of an electric current caused by a polarization inversion of the ferroelectric capacitor 118, and, accordingly, this information can be read.

FIG. 6A to FIG. 6K are schematic sectional views shown in process sequence of a method for manufacturing the ferroelectric memory of FIG. 5.

In this manufacturing method, first, an N type impurity is injected into a surface part of the silicon substrate 102, and, as a result, an $N^+$ type drain region 103 and an $N^+$ type source region 104 are formed as shown in FIG. 6A. Thereafter, a thermally-oxidized film (not shown) is formed on the silicon substrate 102 by thermal oxidation treatment, and is subjected to patterning. As a result, a gate insulating film 105 that extends like a bridge between the drain region 103 and the source region 104 is formed.

Thereafter, by the CVD method, polysilicon (i.e., doped polysilicon) doped with an impurity is deposited on the silicon substrate 102 having the gate insulating film 105, and is subjected to patterning. As a result, a gate electrode 106 is formed on the gate insulating film 105. Thereafter, by the CVD method, silicon oxide is deposited on the silicon substrate 102, and is subjected to etchback. As a result, a sidewall 107 that surrounds the side wall of the gate electrode 106 is formed. In this way, a MOSFET 108 having the gate electrode 106 (Metal), the gate insulating film 105 (Oxide), and the silicon substrate 102 (Semiconductor) including the drain region 103 and the source region 104 is formed as shown in FIG. 6A.

After forming the MOSFET 108, silicon oxide is deposited on the silicon substrate 102 by the CVD method, and, as a result, a first insulating layer 109 is formed. Thereafter, by a well-known patterning technique, the first insulating layer 109 is subjected to patterning, and, as a result, a drain contact hole 110 and a source contact hole 111 are simultaneously formed in the first insulating layer 109.

Thereafter, by the sputtering method, a conductive material that contains titanium is deposited such that the whole of the inner surface of the drain contact hole 110 and that of the source contact hole 111 are covered therewith and such that the upper surface 161 of the first insulating layer 109 is covered therewith. Thereafter, by the CVD method, tungsten is deposited such that the drain contact hole 110 and the source contact hole 111 are filled therewith. Thereafter, the conductive material that contains titanium and the tungsten material are polished by CMP treatment until the upper surface of the tungsten material deposited thereon and the upper surface 161 of the first insulating layer 109 become flush with each other. In this way, a barrier film 112 is formed, and a drain-located metal plug 116 embedded in the drain contact hole 110 is formed via the barrier film 112 as shown in FIG. 6A. Furthermore, a barrier film 113 is formed, and a source-located metal plug 117 embedded in the source contact hole 111 is formed simultaneously with the drain-located metal plug 116 via the barrier film 113.

Thereafter, by a well-known etching technique, an upper part of the drain-located metal plug 116 and an upper part of the source-located metal plug 117 are removed. As a result, the main plug 151 located on the side of the drain region and the main plug 153 located on the side of the source region which are buried to a middle part of the drain contact hole 110 and a middle part of the source contact hole 111, respectively, are formed as shown in FIG. 6B.

Figure 6C:
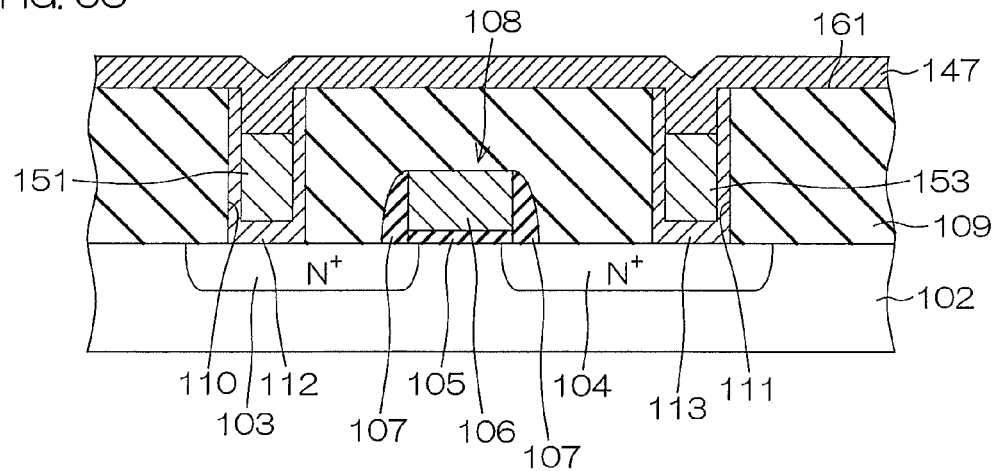
FIG. 6C is a sectional view showing a step subsequent to that of FIG. 6B.

Thereafter, as shown in FIG. 6C, a cap material 147 that is a material used for the cap plug 152 and for the cap plug 154 is deposited such that a space of the drain contact hole 110 and a space of the source contact hole 111 remaining on the main plug 151 and the main plug 153, respectively, are filled therewith and such that the upper surface 161 of the first insulating layer 109 is covered therewith by the sputtering method.

Figure 6D:
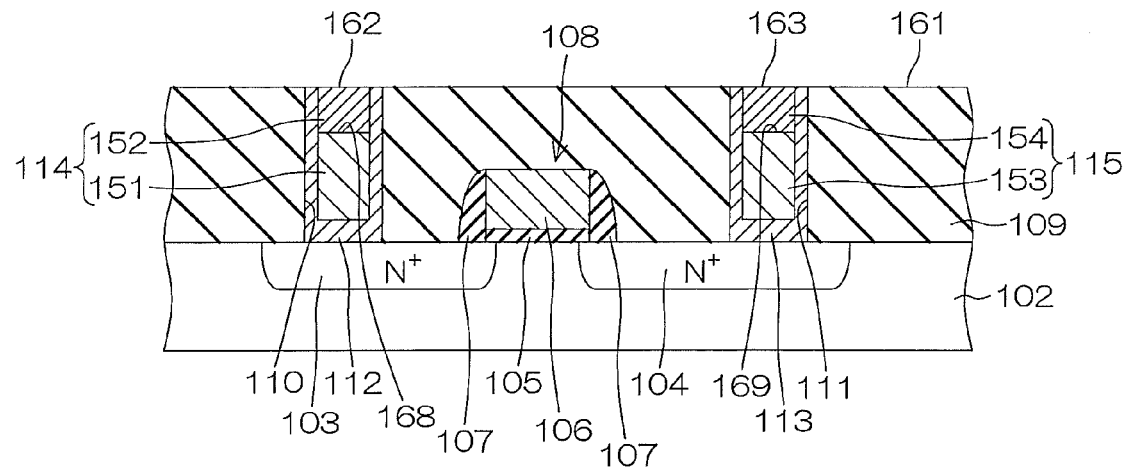
FIG. 6D is a sectional view showing a step subsequent to that of FIG. 6C.

Thereafter, the cap material 147 is polished by CMP treatment until the upper surface of the cap material 147 deposited thereon and the upper surface 161 of the first insulating layer 109 become flush with each other. In this way, the cap plug 152 with which the upper surface 168 of the main plug 151 is covered and the cap plug 154 with which the upper surface 169 of the main plug 153 is covered are simultaneously formed as shown in FIG. 6D. As a result, the drain contact plug 114 and the source contact plug 115 that are embedded in the drain contact hole 110 and the source contact hole 111 via the barrier films 112 and 113, respectively, are formed simultaneously.

Figure 6E:
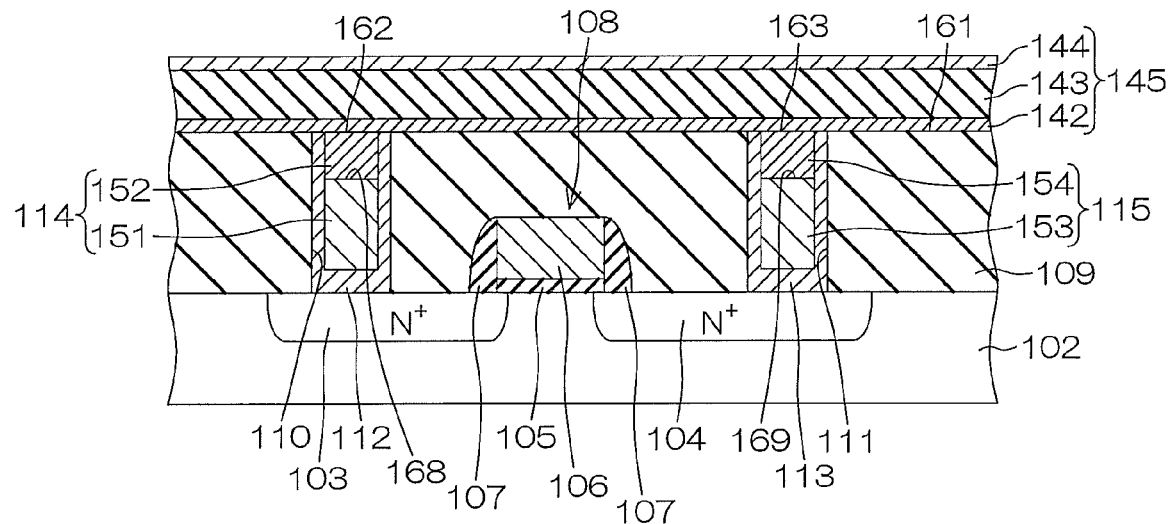
FIG. 6E is a sectional view showing a step subsequent to that of FIG. 6D.

Thereafter, by the sputtering method, a lower conductive material film 142 made of a conductive material that contains a noble metal, a ferroelectric material film 143 made of a ferroelectric material, and an upper conductive material film 144 made of a conductive material that contains a noble metal are sequentially deposited on the first insulating layer 109, and, as a result, a deposit structure 145 is formed as shown in FIG. 6E.

Figure 6F:
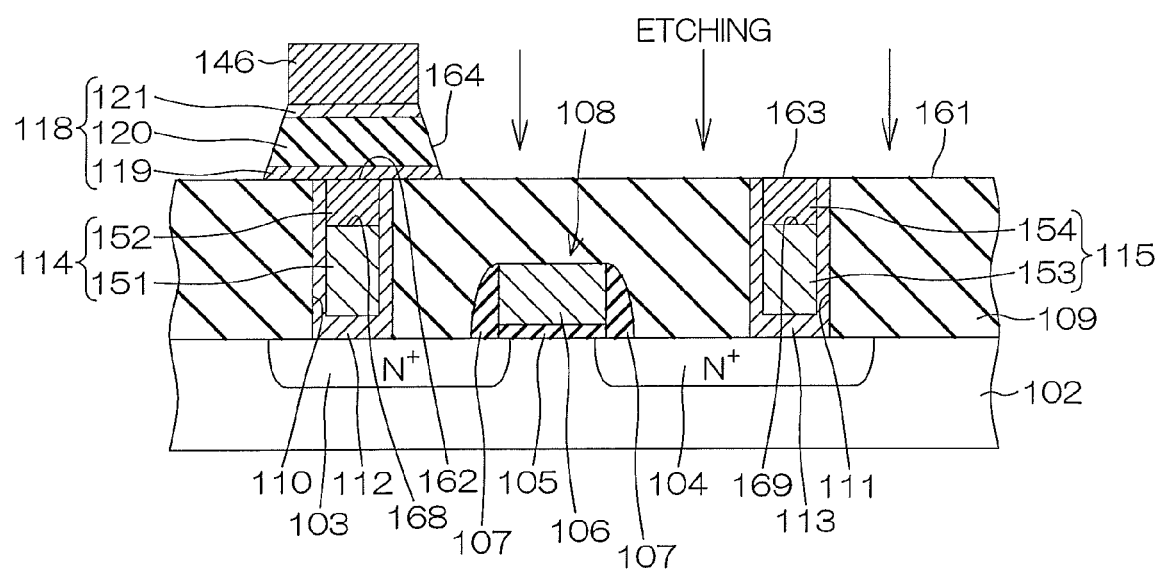
FIG. 6F is a sectional view showing a step subsequent to that of FIG. 6E.
Figure 6G:
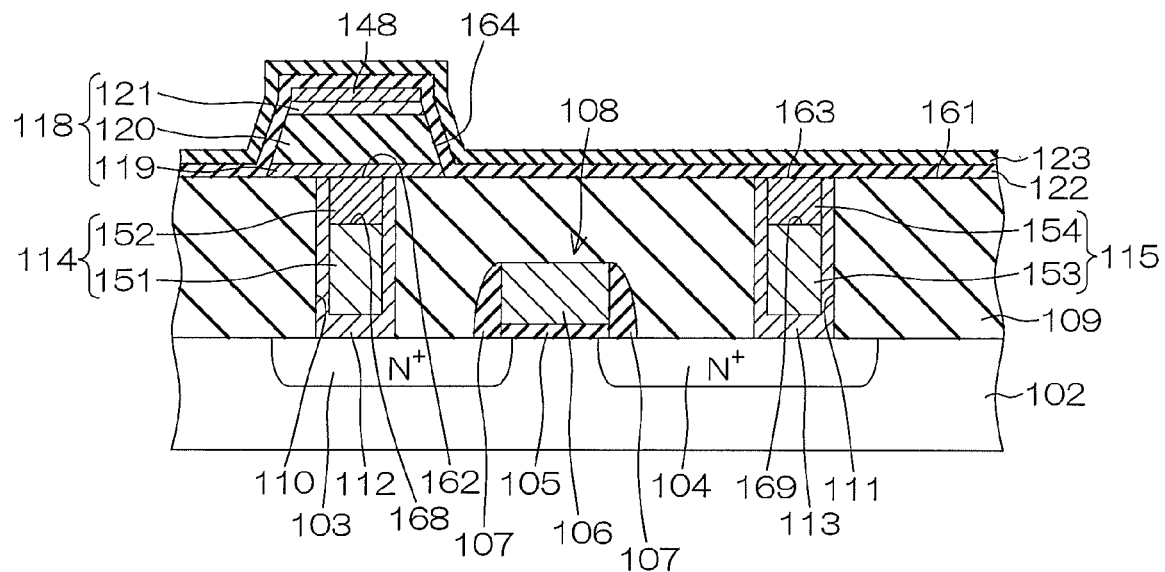
FIG. 6G is a sectional view showing a step subsequent to that of FIG. 6F.

Thereafter, a hard mask 146 having heat-resisting properties (for example, TiN) is formed at a part of the deposit structure 145 located on the drain contact plug 114. Thereafter, the deposit structure 145 is etched vertically with respect to its stacked-layer interface at an etching temperature of, for example, 300° C. or more, and, preferably, at an etching temperature of 350 to 450° C. via the hard mask 146. As a result, in such a manner that the part of the deposit structure 145 located on the drain contact plug 114 remains there, the other parts of the deposit structure 145 except the remaining part are removed. In this way, the mesa-shaped ferroelectric capacitor 118 having the side surface 164 that is inclined at an inclination angle of "a" (for example, a=75 to 85° with respect to the stacked-layer interface I is formed as shown in FIG. 6F. As shown in FIG. 6G, the hard mask 146 that has been thinned by etching remains as the TiN film 148 on the upper electrode 121 of the ferroelectric capacitor 118.

Thereafter, $Al_2O_3$ (alumina) is deposited on the first insulating layer 109 by the sputtering method, and SiN (silicon nitride) is deposited thereon by the PECVD method. As a result, as shown in FIG. 6G, a first hydrogen barrier film 122 and a second hydrogen barrier film 123 are formed such that the first insulating layer 109 is covered therewith and such that the whole of the surface of the ferroelectric capacitor 118 is covered therewith.

Figure 6H:
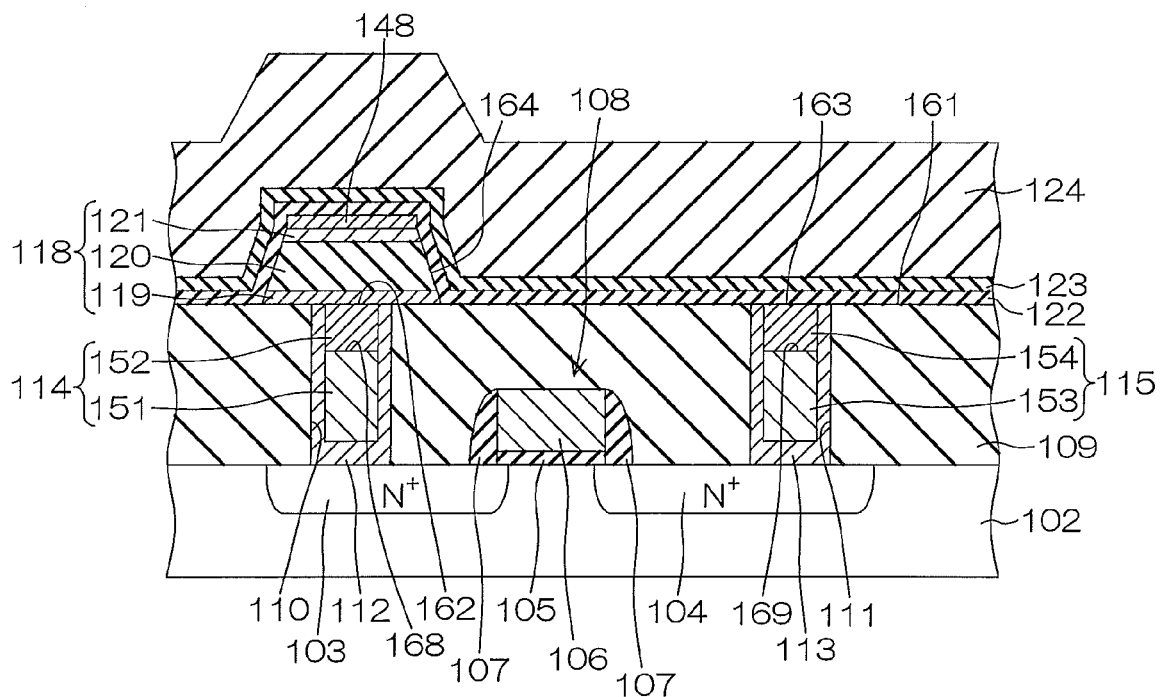
FIG. 6H is a sectional view showing a step subsequent to that of FIG. 6G.

Thereafter, by the CVD method, a second insulating layer 124 made of silicon oxide is stacked on the second hydrogen barrier film 123 as shown in FIG. 6H. At this time, the whole of the surface of the ferroelectric capacitor 118 is covered with the first hydrogen barrier film 122 and the second hydrogen barrier film 123, and therefore the reduction of oxygen in the ferroelectric film 120 by carrier gas can be prevented even if the CVD method in which H (hydrogen) is used as the carrier gas is employed as a method for forming the second insulating layer 124. Therefore, a deterioration in properties of the ferroelectric film 120 can be restrained.

Figure 6I:
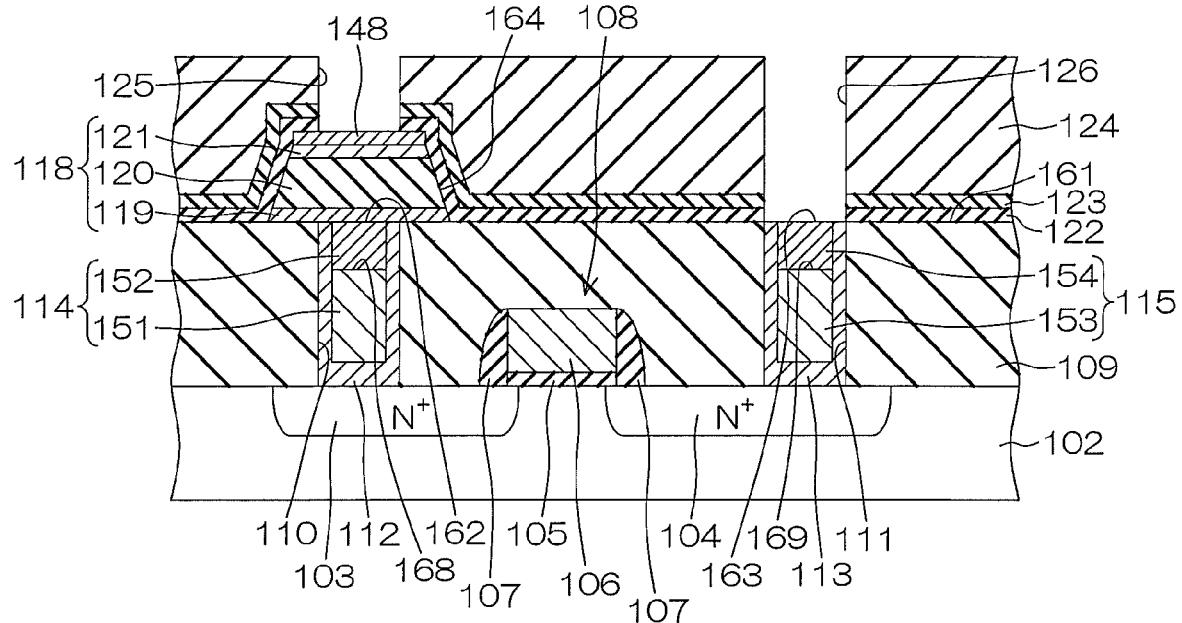
FIG. 6I is a sectional view showing a step subsequent to that of FIG. 6H.

Thereafter, the second insulating layer 124 is polished by CMP treatment, and the surface of the second insulating layer 124 is flattened. Thereafter, as shown in FIG. 6I, the second insulating layer 124, the second hydrogen barrier film 123, and the first hydrogen barrier film 122 are subjected to patterning by a well-known patterning technique, and, as a result, a PL wiring via-hole 125 by which the TiN film 148 is exposed and a BL wiring via-hole 126 by which the upper surface 163 of the source contact plug 115 is exposed are formed simultaneously.

Figure 6J:
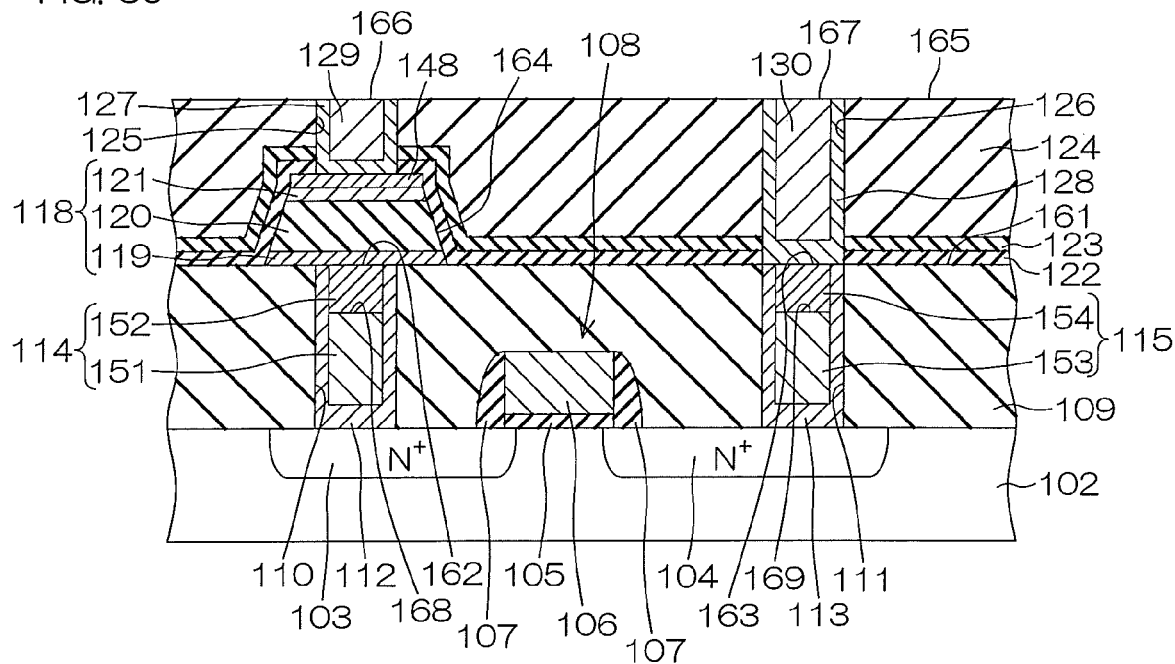
FIG. 6J is a sectional view showing a step subsequent to that of FIG. 6I.

Thereafter, by the sputtering method, a conductive material that contains titanium is deposited such that the inner surface of the PL wiring via-hole 125 and that of the BL wiring via-hole 126 are covered therewith and such that the upper surface 165 of the second insulating layer 124 is covered therewith. Thereafter, by the CVD method, tungsten is deposited such that the PL wiring via-hole 125 and the BL wiring via-hole 126 are filled therewith. Thereafter, the conductive material that contains titanium and the tungsten material are polished by CMP treatment until the upper surface of the tungsten material deposited thereon and the upper surface 165 of the second insulating layer 124 become flush with each other. In this way, a barrier film 127 is formed, and a PL wiring plug 129 embedded in the PL wiring via-hole 125 is formed via the barrier film 127 as shown in FIG. 6J. Furthermore, a barrier film 128 is formed, and a BL wiring plug 130 embedded in the BL wiring via-hole 126 is formed simultaneously with the PL wiring plug 129 via the barrier film 128. The upper surface 166 of the PL wiring plug 129 and the upper surface 167 of the BL wiring plug 130 become flush with the upper surface 165 of the second insulating layer 124.

Thereafter, by the sputtering method, a conductive material that contains titanium, a conductive material that contains aluminum, and a conductive material that contains titanium are stacked on the second insulating layer 124, and are subjected to patterning. As a result, a PL wiring 131 (i.e., a wiring that has a three-layer structure consisting of a titanium layer 133, an aluminum layer 134, and a titanium layer 135) that is brought into electric contact with the PL wiring plug 129 and a BL wiring 132 (i.e., a wiring that has a three-layer structure consisting of a titanium layer 136, an aluminum layer 137, and a titanium layer 138) that is brought into electric contact with the BL wiring plug 130 are formed as shown in FIG. 6K.

Thereafter, the word line 139 is connected to the gate electrode 106, and the plate line 140 is connected to the PL wiring 131, and the bit line 141 is connected to the BL wiring 132.

Figure 6K:
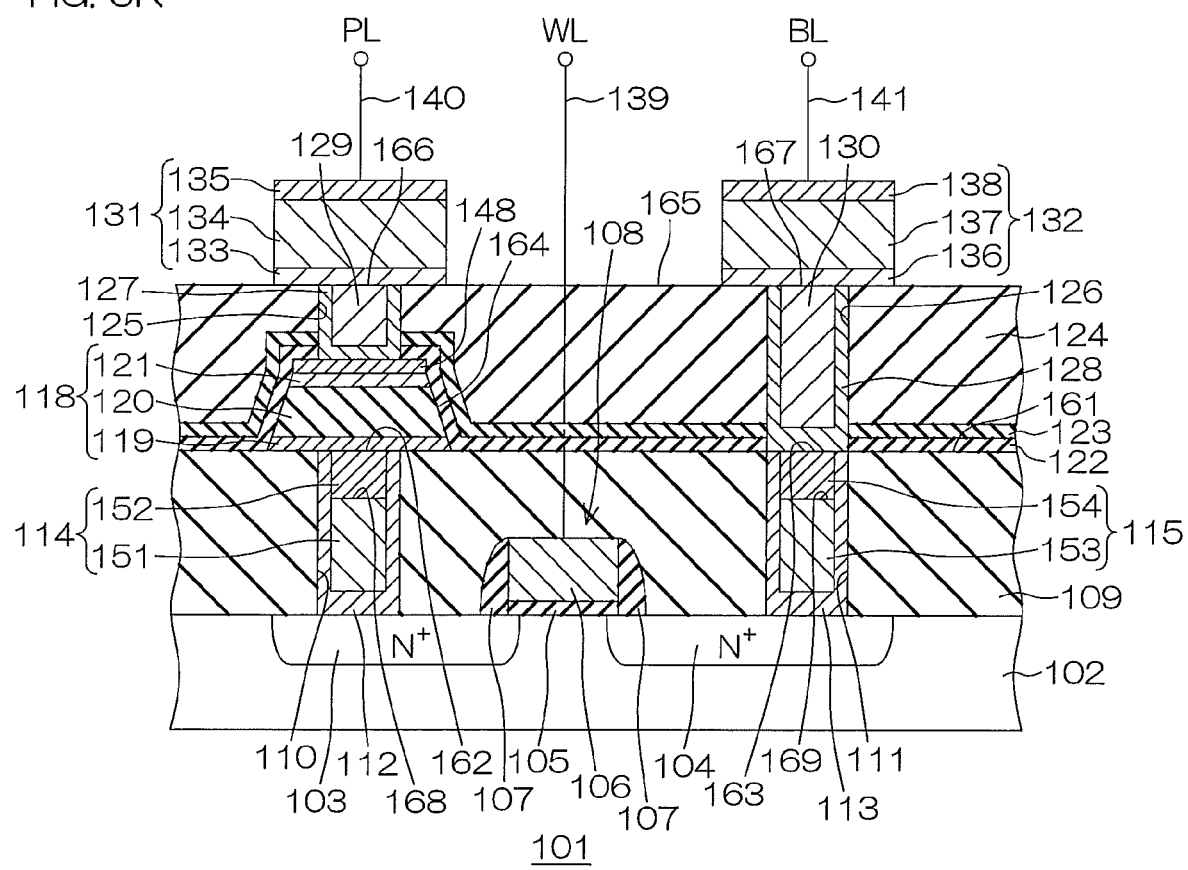
FIG. 6K is a sectional view showing a step subsequent to that of FIG. 6J.
Figure 7A:
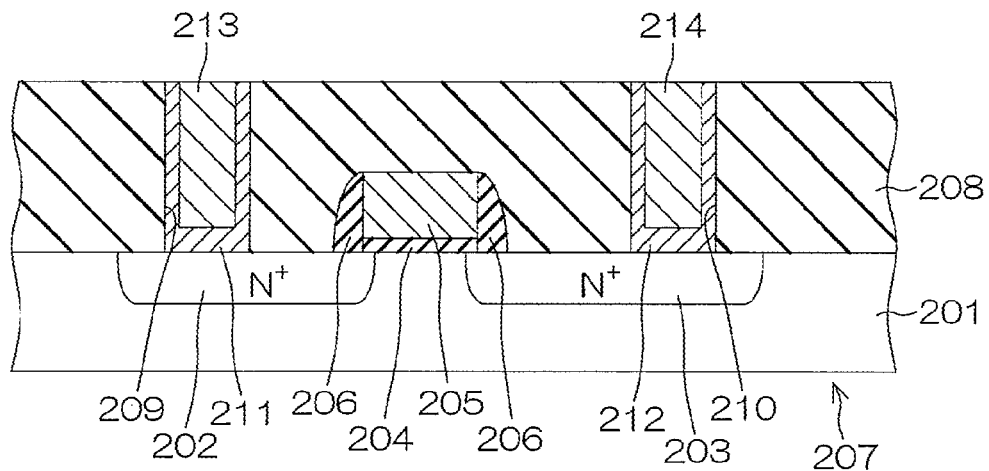
FIG. 7A is a schematic sectional view of a method for manufacturing a conventional ferroelectric memory shown in process sequence.
Figure 7B:
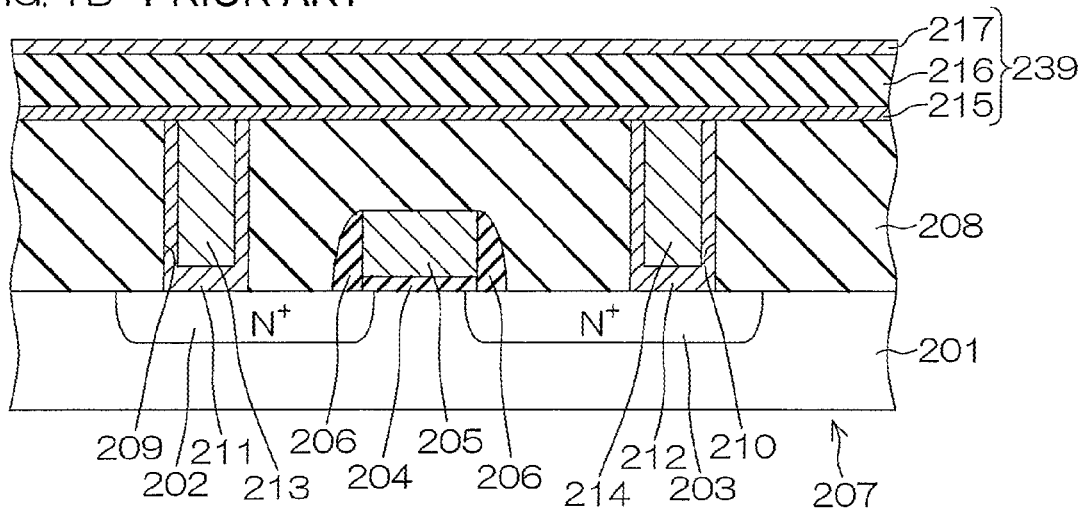
FIG. 7B is a sectional view showing a step subsequent to that of FIG. 7A.
Figure 7C:
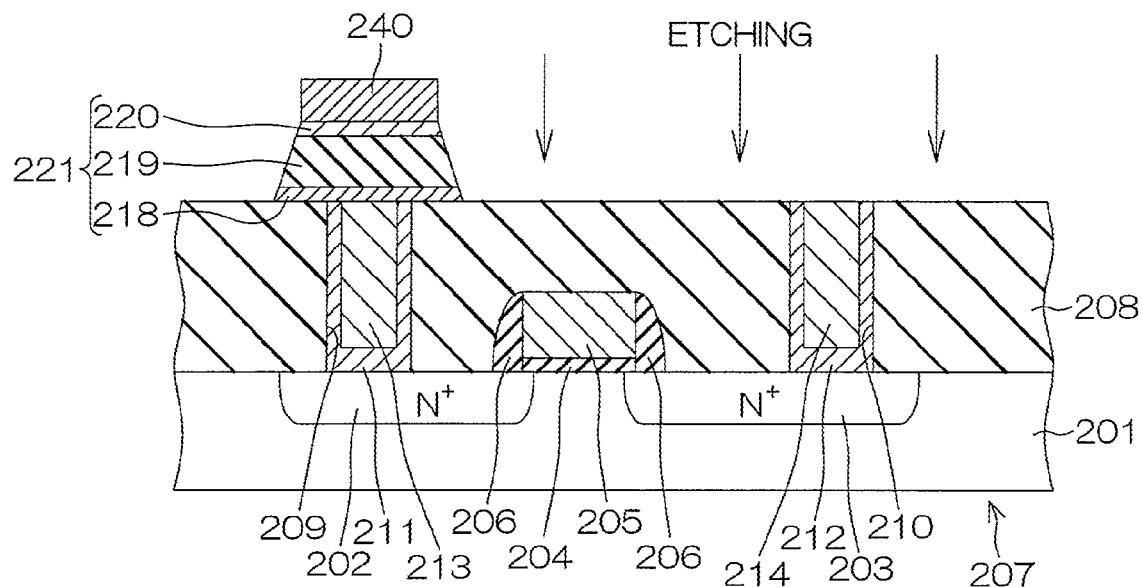
FIG. 7C is a sectional view showing a step subsequent to that of FIG. 7B.
Figure 7D:
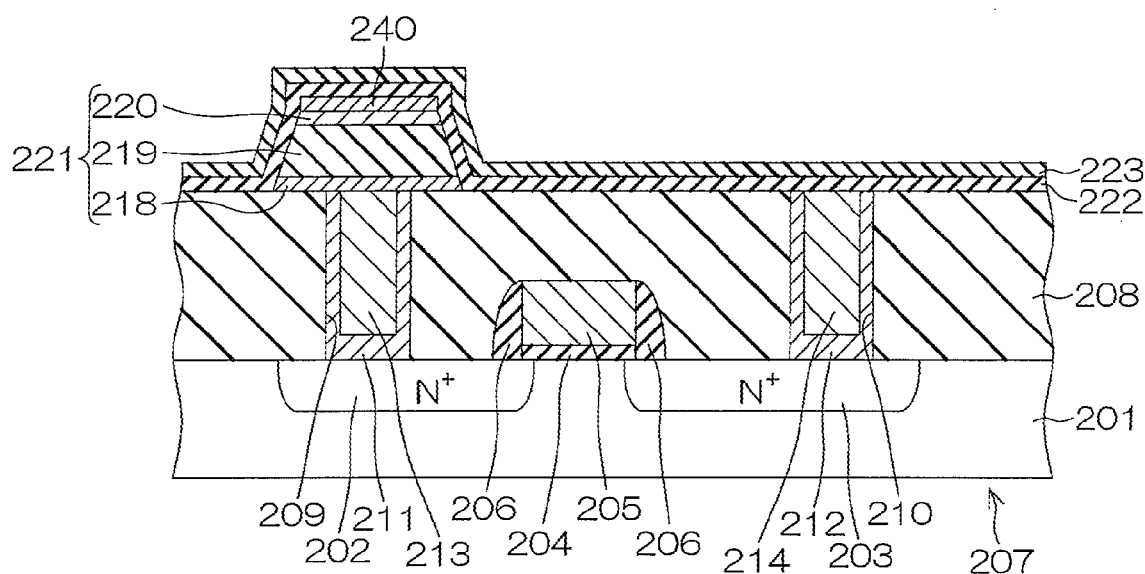
FIG. 7D is a sectional view showing a step subsequent to that of FIG. 7C.
Figure 7E:
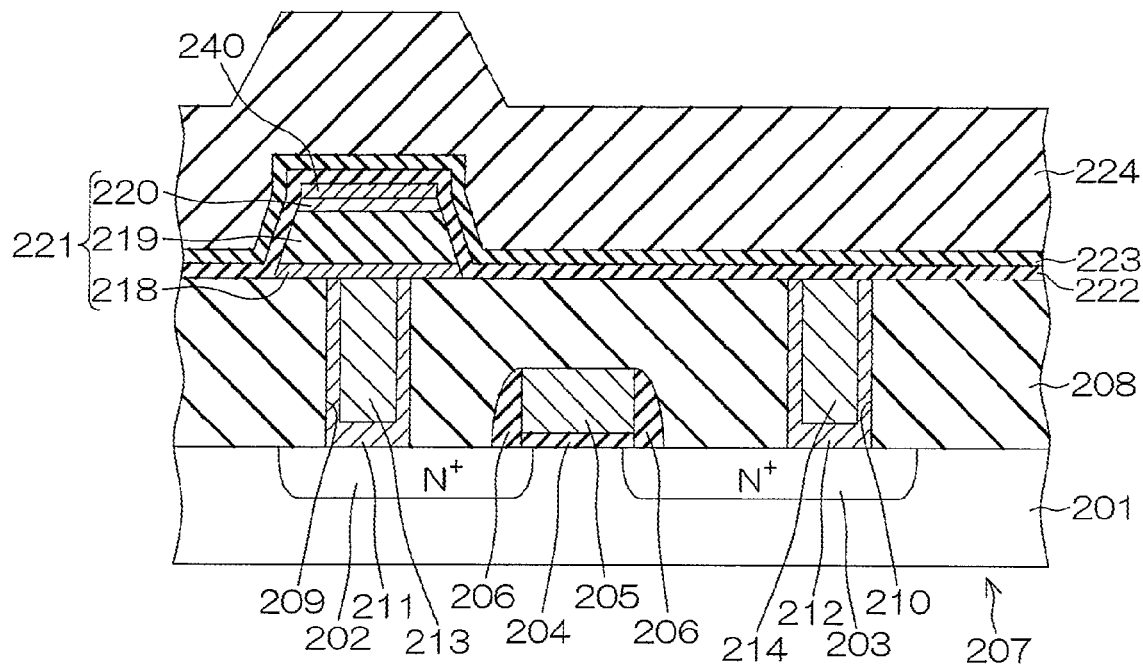
FIG. 7E is a sectional view showing a step subsequent to that of FIG. 7D.
Figure 7F:
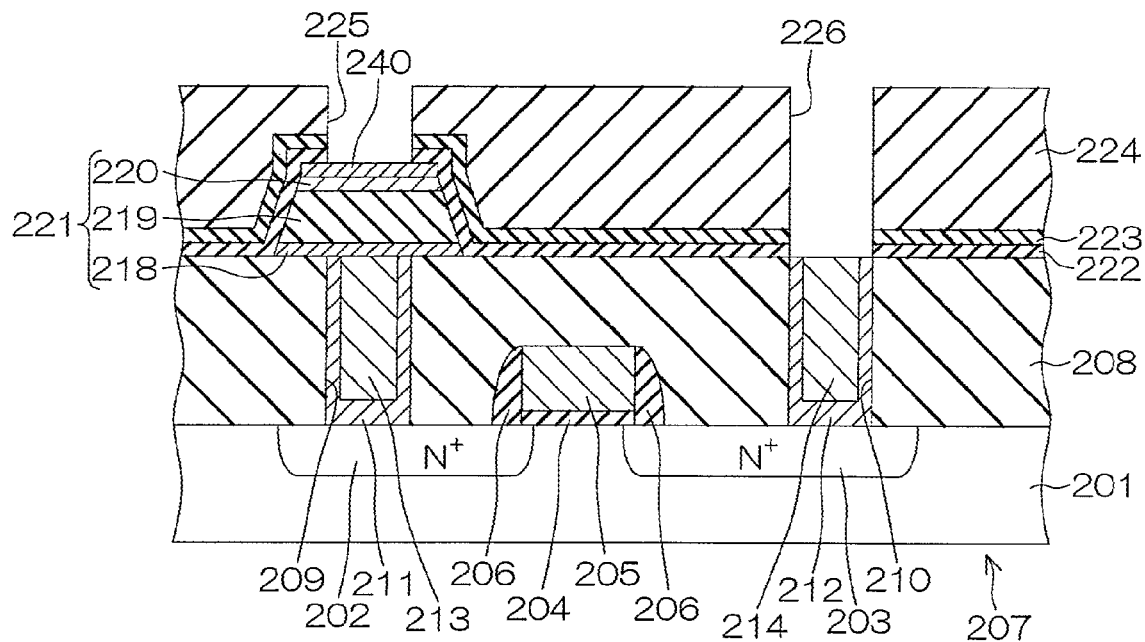
FIG. 7F is a sectional view showing a step subsequent to that of FIG. 7E.
Figure 7G:
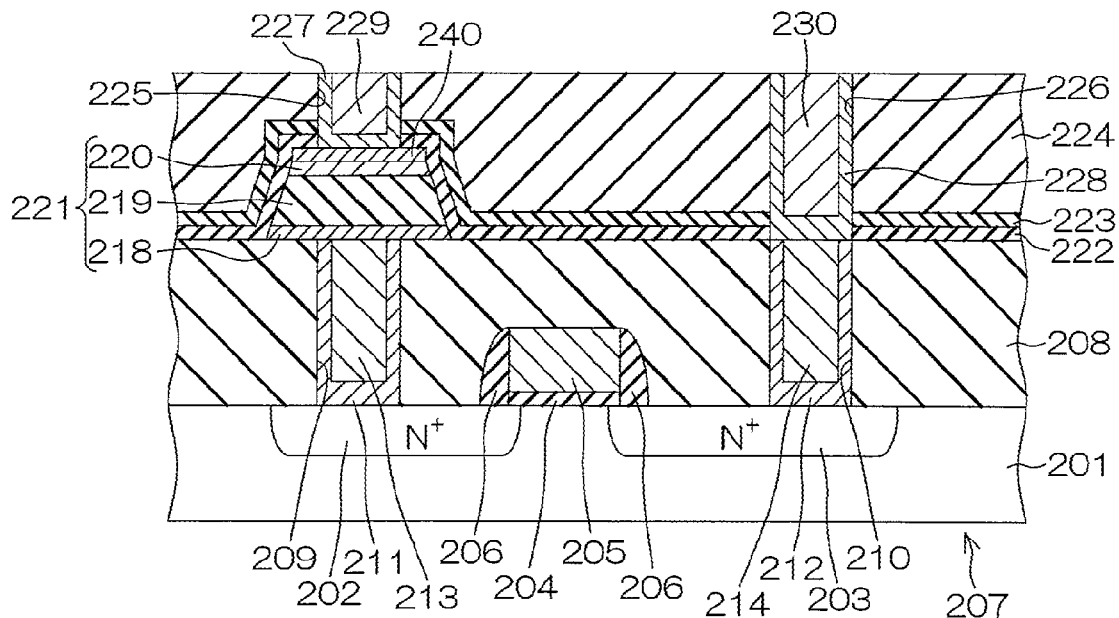
FIG. 7G is a sectional view showing a step subsequent to that of FIG. 7F.
Figure 7H:
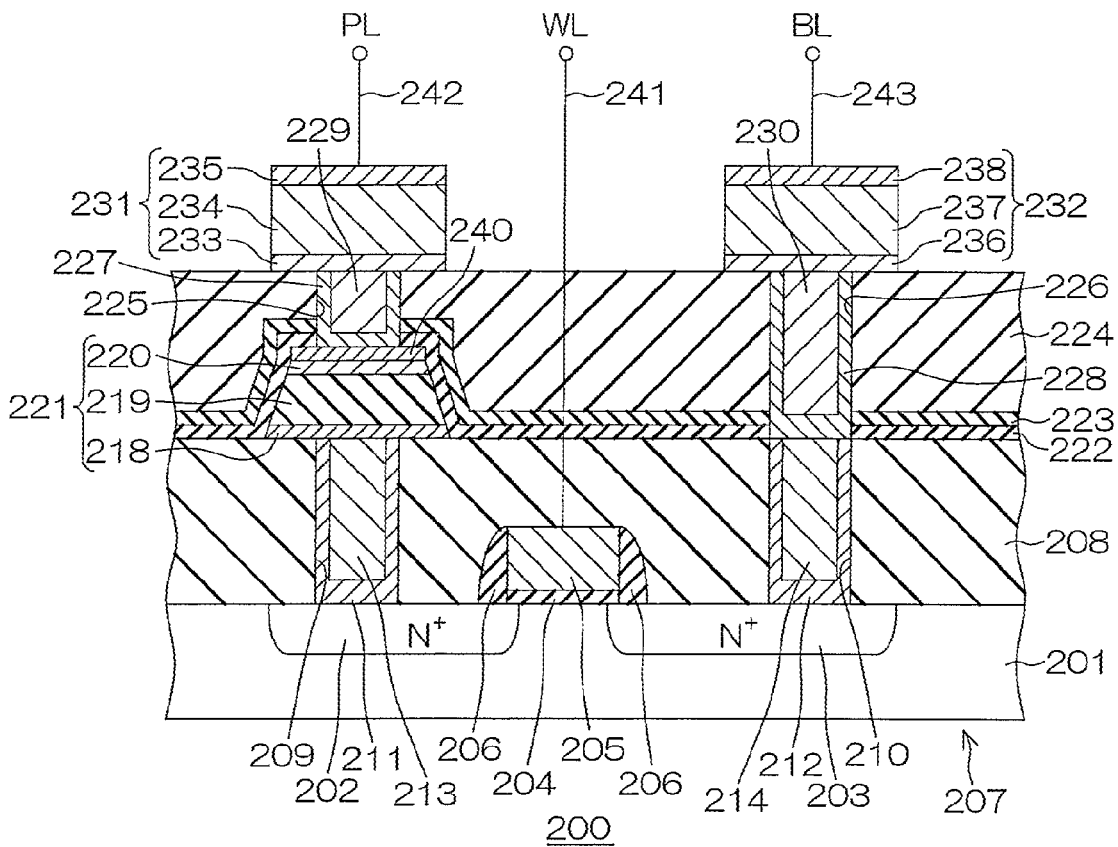
FIG. 7H is a sectional view showing a step subsequent to that of FIG. 7G.

In this way, a ferroelectric memory 101 including the ferroelectric capacitor 118 can be obtained as shown in FIG. 6K.

As described above, in the ferroelectric memory 101, the upper surface 169 of the main plug 153 on the source side is covered with the cap plug 154. The upper surface 169 of the main plug 153 is covered with the cap plug 154, and, accordingly, is protected by the cap plug 154.

In the above-mentioned manufacturing method, after forming this cap plug 154, the deposit structure 145 is formed on the first insulating layer 109, and the hard mask 146 having heat-resisting properties is formed at the part of the deposit structure 145 (i.e., the part thereof on the drain contact plug 114). Thereafter, the deposit structure 145 is etched via the hard mask 146, and, as a result, the ferroelectric capacitor 118 is formed.

When the deposit structure 145 is etched, the main plug 153 is covered with the cap plug 154. Additionally, as described above, the cap plug 154 is made of a conductive material having an etching selection ratio with respect to the lower electrode 119 and that of the upper electrode 121. Therefore, protection given by the cap plug 154 makes it possible to prevent the main plug 153 from being abnormally etched even if the deposit structure 145 is etched at a high temperature of 300° C. or more as mentioned above. As a result, it is possible to inhibit the occurrence of an electrical conduction failure between the source contact plug 115, which consists of the main plug 153 and the cap plug 154, and the BL wiring plug 130 connected thereto, and it is possible to restrain a decrease in reliability.

Additionally, if the cap plug 154 is a conductive nitride, the etching selection ratio can be set as a great value with respect to the lower electrode 119 and the upper electrode 121, and therefore the main plug 153 can be effectively prevented from being abnormally etched.

Additionally, the deposit structure 145 is etched at a high temperature, and therefore the side surface 164 of the ferroelectric capacitor 118 can be formed to be a steeply oblique surface with respect to the stacked-layer interface I. As a result, the area of the ferroelectric capacitor 118 can be reduced, and therefore the ferroelectric memory 101 can be miniaturized.

Additionally, the main plug 151 and the cap plug 152 are embedded in the drain contact hole 110. Likewise, the main plug 153 and the cap plug 154 are embedded in the source contact hole 111. In other words, a structure embedded in the drain contact hole 110 and a structure embedded in the source contact hole 111 are identical with each other.

Therefore, with regard to the formation of the drain contact plug 114 and the source contact plug 115, the drain contact hole 110 and the source contact hole 111 are formed simultaneously, and the drain-located metal plug 116 and the source-located metal plug 117 with which these contact holes are respectively filled are formed (see FIG. 6A). Thereafter, these plugs are etched, and, as a result, the main plug 151 on the drain side and the main plug 153 on the source side are simultaneously formed (see FIG. 6B).

Thereafter, the conductive cap material 147 with which a space of the drain contact hole 110 and a space of the source contact hole 111 remaining on the main plug 151 and the main plug 153, respectively, are filled is deposited (see FIG. 6C), and is polished by CMP treatment. The cap plug 152 on the drain side and the cap plug 154 on the source side are simultaneously formed by this polishing treatment, and the drain contact plug 114 and the source contact plug 115 are formed simultaneously (see FIG. 6D).

As described above, a step of forming the main plug 151 on the drain side and a step of forming the main plug 153 on the source side are performed in parallel with each other, and, likewise, a step of forming the cap plug 152 on the drain side with which the upper surface 168 of the main plug 151 is covered and a step of forming the cap plug 154 on the source side with which the upper surface 169 of the main plug 153 is covered are performed in parallel with each other. Therefore, the manufacturing process of the ferroelectric memory 101 can be simplified.

Although the embodiments of the present invention have been described as above, the present invention can be embodied in other forms.

For example, it is permissible to employ a structure in which the conductivity type of each semiconductor part of the ferroelectric memories 1 and 101 is reversed. In other words, in the ferroelectric memories 1 and 101, the P type part may be an N type, and the N type part may be a P type.

Additionally, the cell structure of each memory cell of the ferroelectric memories 1 and 101 may be, for example, a 2T2C type if this cell structure allows a combination of a ferroelectric capacitor and a MOSFET.

Additionally, it is permissible for the drain contact plug 114 not to have the cap plug 152. In this case, it is recommended to form the main plug 151 by filling the drain contact hole 110 with a metallic material, such as tungsten, until its surface 168 and the upper surface 161 of the first insulating layer 109 become flush with each other.

Additionally, it is permissible for the source contact plug 115 not to have the cap plug 154, and, in this case, it is recommended to cover the upper surface of the source contact plug 115 with, for example, a material film made of a conductive material having an etching selection ratio with respect to the lower electrode 119 and the upper electrode 121.

Although the embodiments of the present invention have been described in detail, these embodiments are merely concrete examples used to clarify the technical contents of the present invention, and therefore the present invention should not be limited to these concrete examples and should not be interpreted thereby, and the spirit and the scope of the present invention are limited only by the appended claims.

This application is based on Japanese Patent Application No. 2008-236647, filed in Japan Patent Office on Sep. 16, 2008, and Japanese Patent Application No. 2008-236648, filed in Japan Patent Office on Sep. 16, 2008, the complete disclosure of which is hereby incorporated by reference.

DESCRIPTION OF SIGNS

1 . . . Ferroelectric memory, 9 . . . First insulating layer, 14 . . . Drain contact plug, 15 . . . Source contact plug, 16 . . . Interlayer insulating film, 17 . . . Opening, 18 . . . Ferroelectric capacitor, 19 . . . Lower electrode, 20 . . . Ferroelectric film, 21 . . . Upper electrode, 42 . . . Lower conductive material film, 43 . . . Ferroelectric material film, 44 . . . Upper conductive material film, 45 . . . Deposit structure, 62 . . . Upper surface, 63 . . . Upper surface, 101 . . . Ferroelectric memory, 109 . . . First insulating layer, 110 . . . Drain contact hole, 111 . . . Source contact hole, 114 . . . Drain contact plug, 115 . . . Source contact plug, 116 . . . Drain-located metal plug, 117 . . . Source-located metal plug, 118 . . . Ferroelectric capacitor, 119 . . . Lower electrode, 120 . . . Ferroelectric film, 121 . . . Upper electrode, 142 . . . Lower conductive material film, 143 . . . Ferroelectric material film, 144 . . . Upper conductive material film, 145 . . . Deposit structure, 147 . . . Cap material, 161 . . . Upper surface, 162 . . . Upper surface, 163 . . . Upper surface, 168 . . . Upper surface, 169 . . . Upper surface

The invention claimed is:

1. A semiconductor storage device comprising:
an insulating layer;
a ferroelectric capacitor disposed on the insulating layer, the ferroelectric capacitor including a lower electrode, a ferroelectric film, and an upper electrode;
an interlayer insulating film formed on the insulating layer, the interlayer insulating film having an opening at a part thereof at which the ferroelectric capacitor is disposed;
a first metal plug embedded in the insulating layer and connected to the lower electrode via the opening;
a second metal plug embedded in the insulating layer outside the ferroelectric capacitor when viewed planarly; and
a hydrogen barrier film partially covering the ferroelectric capacitor and the interlayer insulating film, wherein
an upper surface of the interlayer insulating film is in a level that is higher than a level that an upper surface of the first metal plug is in so that a step is between the upper surface of the interlayer insulating film and the upper surface of the first metal plug,
the lower electrode is formed continuously on the upper surface of the interlayer insulating film, the upper surface of the first metal plug and the step, and
the upper surface of the interlayer insulating film and the upper surface of the first metal plug are interlinked via a curved portion of the interlayer insulating film.

2. The semiconductor storage device according to claim 1, wherein the upper surface of the first metal plug and an upper surface of the second metal plug are flush with each other.

3. The semiconductor storage device according to claim 1, wherein the hydrogen barrier film includes a SiN film.

4. The semiconductor storage device according to claim 3, wherein the hydrogen barrier film further includes an $Al_2O_3$ film formed under the SiN film.

5. The semiconductor storage device according to claim 3, wherein the hydrogen barrier film further includes an $Al_2O_3$ film formed between the SiN film and the interlayer insulating film.

6. The semiconductor storage device according to claim 1, further comprising a second insulating layer made of $SiO_2$ formed on the hydrogen barrier film.

7. The semiconductor storage device according to claim 1, further comprising a MOSFET embedded in the insulating layer.

8. The semiconductor storage device according to claim 1, wherein each of the ferroelectric film, the upper electrode and the lower electrode is composed of a material that is different than that of the hydrogen barrier film.

9. The semiconductor storage device according to claim 1, wherein the interlayer insulating film, the ferroelectric capacitor and the hydrogen barrier film are stacked in that stated order along a straight line.

10. The semiconductor storage device according to claim 1, wherein the lower electrode touches each of the upper surface of the interlayer insulating film, the upper surface of the first metal plug and the step.

11. The semiconductor storage device according to claim 1, wherein a thickness of the lower electrode is 0.05 to 0.2 μm.

12. The semiconductor storage device according to claim 1, wherein the step includes an inclination connecting the upper surface of the interlayer insulating film with the upper surface of the first metal plug.

13. A semiconductor storage device comprising:
an insulating layer;
a ferroelectric capacitor disposed on the insulating layer, the ferroelectric capacitor including a lower electrode, a ferroelectric film, and an upper electrode;
an interlayer insulating film formed on the insulating layer, the interlayer insulating film having an opening at a part thereof at which the ferroelectric capacitor is disposed;
a first metal plug embedded in the insulating layer and connected to the lower electrode via the opening; and
a hydrogen barrier film partially covering the ferroelectric capacitor and the interlayer insulating film, wherein
an upper surface of the interlayer insulating film is in a level that is higher than a level that an upper surface of the first metal plug is in so that a step is between the upper surface of the interlayer insulating film and the upper surface of the first metal plug, the lower electrode is formed continuously on the upper surface of the interlayer insulating film, the upper surface of the first metal plug and the step, and the upper surface of the interlayer insulating film and the upper surface of the first metal plug are interlinked via a curved portion of the interlayer insulating film.

14. The semiconductor storage device according to claim 13, wherein the lower electrode touches each of the upper surface of the interlayer insulating film, the upper surface of the first metal plug and the step.

15. A semiconductor storage device comprising:

an insulating layer;

a ferroelectric capacitor disposed on the insulating layer, the ferroelectric capacitor including a lower electrode, a ferroelectric film, and an upper electrode;

an interlayer insulating film formed on the insulating layer, the interlayer insulating film having an opening at a part thereof at which the ferroelectric capacitor is disposed;

a first metal plug embedded in the insulating layer and connected to the lower electrode via the opening; and a hydrogen barrier film on the ferroelectric capacitor and the interlayer insulating film, wherein an upper surface of the interlayer insulating film is disposed in a position higher than a position of an upper surface of the first metal plug, the lower electrode being formed continuously on the upper surface of the interlayer insulating film, the upper surface of the first metal plug and the between the upper surface of the interlayer insulating film and the upper surface of the first metal plug, and a curved portion of the interlayer insulating film being between the upper surface of the interlayer insulating film and the upper surface of the first metal plug.

* * * * *